(12) United States Patent
Yamauchi et al.

(10) Patent No.: US 12,150,239 B2
(45) Date of Patent: Nov. 19, 2024

(54) METHOD FOR MANUFACTURING SHIELDED PRINTED WIRING BOARD AND SHIELDED PRINTED WIRING BOARD

(71) Applicant: Tatsuta Electric Wire & Cable Co., Ltd., Higashiosaka (JP)

(72) Inventors: Sirou Yamauchi, Kizugawa (JP); Hiroshi Tajima, Kizugawa (JP); Yuusuke Haruna, Kizugawa (JP); Takahiko Katsuki, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 514 days.

(21) Appl. No.: 17/298,394

(22) PCT Filed: Dec. 10, 2019

(86) PCT No.: PCT/JP2019/048304
§ 371 (c)(1),
(2) Date: May 28, 2021

(87) PCT Pub. No.: WO2020/122071
PCT Pub. Date: Jun. 18, 2020

(65) Prior Publication Data
US 2021/0410272 A1    Dec. 30, 2021

(30) Foreign Application Priority Data

Dec. 11, 2018    (JP) .................. 2018-231746

(51) Int. Cl.
*H05K 3/28* (2006.01)
*H05K 1/02* (2006.01)
(Continued)

(52) U.S. Cl.
CPC ........... *H05K 1/0216* (2013.01); *H05K 3/281* (2013.01); *H05K 9/0088* (2013.01);
(Continued)

(58) Field of Classification Search
CPC ........... H05K 3/281; H05K 2203/1383; H05K 1/0216; H05K 2201/0715; H05K 9/0088; H05K 2203/1126; H05K 2203/1131
See application file for complete search history.

(56) References Cited

U.S. PATENT DOCUMENTS 5,003,126 A * 3/1991 Fujii .................... G02B 6/4403
                                                  174/117 FF
10,651,526 B2 * 5/2020 Bae ........................ H01P 5/028
(Continued)

FOREIGN PATENT DOCUMENTS

CN    104023511 A    9/2014
JP    H08125380 A    5/1996
(Continued)

OTHER PUBLICATIONS

Tai et al, "EMI shielding performance by metal plating on mold compound," 2016 IEEE 37th International Electronics Manufacturing Technology (IEMT) & 18th Electronics Materials and Packaging (EMAP) Conference, Georgetown, Malaysia, 2016, pp. 1-4. (Year: 2016).*
Machine Translation of Japanese Patent Publication, JP 8-125380, 2024.*
Machine Translation of Japanese Patent Publication, JP 2017-147448, 2024.*
(Continued)

*Primary Examiner* — A. Dexter Tugbang
(74) *Attorney, Agent, or Firm* — United IP Counselors, LLC

(57) ABSTRACT

A shielded printed wiring board with electromagnetic wave shielding film on both sides thereof is produced by placing electromagnetic wave shielding films on the two sides of the printed wiring board, with ends thereof protruding past an end of the printed wiring board. The protruding ends of the electromagnetic wave shielding films are brought together, with an air gap therebetween, and an initial application of heat and pressure causes the ends of the electromagnetic wave shielding film to adhere to each other, but without completely curing adhesive resin components of the electromagnetic wave shielding films. Protective film layers are removed from the electromagnetic wave shielding films, followed by subsequent application of heat and pressure to complete cure of the adhesive resin and to remove the air gap.

20 Claims, 13 Drawing Sheets

(51) Int. Cl.
 *H05K 9/00* (2006.01)
 *H05K 1/03* (2006.01)

(52) U.S. Cl.
 CPC .... *H05K 1/0393* (2013.01); *H05K 2203/1126* (2013.01); *H05K 2203/1131* (2013.01); *H05K 2203/1383* (2013.01); *H05K 2203/1572* (2013.01)

(56) References Cited

U.S. PATENT DOCUMENTS

| | | | |
|---|---|---|---|
| 2008/0171139 A1* | 7/2008 | Ueno | H05K 3/281 427/97.1 |
| 2013/0206315 A1 | 8/2013 | Chung et al. | |
| 2016/0205817 A1 | 7/2016 | Tajima et al. | |
| 2018/0146543 A1* | 5/2018 | Chen | H05K 1/05 |

FOREIGN PATENT DOCUMENTS

| | | | |
|---|---|---|---|
| JP | 2004095566 A | | 3/2004 |
| JP | 2006013076 A | | 1/2006 |
| JP | 2013538439 A | | 10/2013 |
| JP | 2017147448 A | | 8/2017 |
| JP | 2018041953 A | | 3/2018 |
| JP | 2018056330 A | | 4/2018 |
| JP | 2021160237 A | * | 10/2021 |
| TW | 201841742 A | | 12/2018 |

OTHER PUBLICATIONS

International Search Report dated Feb. 25, 2020, issued in International Application No. PCT/JP2019/048304.
Written Opinion dated Feb. 25, 2020, issued in International Application No. PCT/JP2019/048304.

* cited by examiner

METHOD FOR MANUFACTURING SHIELDED PRINTED WIRING BOARD AND SHIELDED PRINTED WIRING BOARD

TECHNICAL FIELD

The present invention relates to a method of producing a shielded printed wiring board and a shielded printed wiring board.

BACKGROUND ART

Flexible printed wiring boards are widely used to incorporate circuits into complicated mechanisms of electronic devices, such as mobile phones, video cameras, and notebook computers, which are rapidly becoming smaller with higher functionality. Owing to their excellent flexibility, flexible printed wiring boards are also used to connect a movable part such as a printer head to a control unit. These electronic devices require electromagnetic wave shielding, and flexible printed wiring boards for use in these devices are now increasingly provided with electromagnetic wave shielding (hereinafter such flexible printed wiring boards also referred to as "shielded printed wiring boards").

An exemplary shielded printed wiring board includes a printed wiring board sequentially containing a printed circuit and a coverlay on a base film; and an electromagnetic wave shielding film containing an adhesive layer, a shielding layer laminated on the adhesive layer, and an insulating layer laminated on the shielding layer.

The electromagnetic wave shielding film is laminated on the printed wiring board so that the adhesive layer is in contact with the printed wiring board. The adhesive layer and the printed wiring board adhered each other can provide a shielded printed wiring board.

Patent Literature 1 discloses a shielded printed wiring board including a shielding layer on each face of a printed wiring board and a method of producing the same.

CITATION LIST

Patent Literature
Patent Literature 1: JP H08-125380 A

SUMMARY OF INVENTION

Technical Problem

Patent Literature 1 discloses a method of forming a shielding layer on each face of the printed wiring board by attaching a film with conductive adhesive (i.e., electromagnetic wave shielding film) to each face of the printed wiring board.

When a shielded printed wiring board is produced by the method, the electromagnetic wave shielding film on one face and the electromagnetic wave shielding film on the other face are attached to each other with the adhesive layers of the electromagnetic wave shielding films therebetween. In this case, a gap may be created between the adhesive layer of the electromagnetic wave shielding film on one face and the adhesive layer of the electromagnetic wave shielding film on the other face.

On the shielded printed wiring board are mounted electronic components or the like. When electronic components or the like are mounted, the shielded printed wiring board is heated.

When the shielded printed wiring board is heated, the air in a gap between the adhesive layer of the electromagnetic wave shielding film on one face and the adhesive layer of the electromagnetic wave shielding film on the other face expands with heat. As a result, problematically, the adhesive layer of the electromagnetic wave shielding film on one face may be separated from the adhesive layer of the electromagnetic wave shielding film on the other face.

The present invention has been made in view of the above problems and aims to provide a method of producing a shielded printed wiring board capable of sufficiently adhering to each other a printed wiring board, an adhesive layer of an electromagnetic wave shielding film on one face of the printed wiring board, and an adhesive layer of an electromagnetic wave shielding film on the other face of the printed wiring board.

Solution to Problem

Specifically, the method of producing a shielded printed wiring board includes:
  a printed wiring board preparing step of preparing a printed wiring board including a base film, a printed circuit formed on the base film, and a coverlay covering the printed circuit;
  a first electromagnetic wave shielding film preparing step of preparing a first electromagnetic wave shielding film sequentially including a first protective film, a first insulating layer, and a first adhesive layer;
  a second electromagnetic wave shielding film preparing step of preparing a second electromagnetic wave shielding film sequentially including a second protective film, a second insulating layer, and a second adhesive layer;
  a first electromagnetic wave shielding film placing step of placing the first electromagnetic wave shielding film on the printed wiring board so that the first adhesive layer is in contact with one face of the printed wiring board, and part of the first adhesive layer protrudes from an end of the printed wiring board to form a first extending end portion;
  a second electromagnetic wave shielding film placing step of placing the second electromagnetic wave shielding film on the printed wiring board so that the second adhesive layer is in contact with the other face of the printed wiring board, and part of the second adhesive layer protrudes from an end of the printed wiring board to form a second extending end portion;
  a stacking step of stacking the first extending end portion on the second extending end portion so that a gap is created between the first extending end portion and the second extending end portion, whereby a first intermediate product is prepared;
  an initial pressing step of pressurizing and heating the first intermediate product to the extent that the first adhesive layer and the second adhesive layer are not completely cured, whereby a second intermediate product is prepared;
  a protective film peeling step of peeling off the first protective film and the second protective film from the second intermediate product, whereby a third intermediate product is prepared; and
  a subsequent pressing step of pressurizing and heating the third intermediate product to cure the first adhesive layer and the second adhesive layer, whereby a shielded printed wiring board is prepared.

The method of producing a shielded printed wiring board of the present invention includes the stacking step in which the first adhesive layer is stacked on the second adhesive layer so that a gap is created between the first extending end portion and the second extending end portion.

In the method of producing a shielded printed wiring board of the present invention, as described later, the first adhesive layer and the second adhesive layer are cured in two steps by the initial pressing step and the subsequent pressing step.

Even when a gap is created between the first extending end portion and the second extending end portion in the stacking step, these steps can remove the air from the gap and achieve sufficient adhesion between the first adhesive layer and the second adhesive layer.

If the first adhesive layer is stacked on the second adhesive layer without creating such a gap in the stacking step, the stacking requires high pressure and takes a long time, resulting in poor productivity.

The method of producing a shielded printed wiring board of the present invention includes the initial pressing step in which pressurizing and heating are performed to the extent that the first adhesive layer and the second adhesive layer are not completely cured. In other words, in the initial pressing step, the first adhesive layer and the second adhesive layer are semi-cured.

The semi-curing the first adhesive layer and the second adhesive layer can fix the positions of the first electromagnetic wave shielding film and the second electromagnetic wave shielding film.

Thus, in the protective film peeling step, the first protective film and the second protective film are easily peeled off.

In addition, since pressure and heat are applied through the first protective film and the second protective film, the pressure can be uniformly applied to the first intermediate product.

In addition, the subsequent pressing step can achieve easiness of removing the air from a gap between the first adhesive layer and the second adhesive layer.

Herein, the "semi-curing" encompasses a B-stage. The B-stage means an intermediate stage where the material swells when in contact with certain liquids and softens when heated, but does not dissolve or fuse entirely as defined in JIS K 6900-1994.

In the method of producing a shielded printed wiring board of the present invention, the first protective film and the second protective film are peeled off in the protective film peeling step before the subsequent pressing step.

When the first protective film and the second protective film are peeled off, the pressure is less likely to be absorbed in the subsequent pressing step. Thus, even when a gap is present between the first adhesive layer and the second adhesive layer of the first intermediate product, the air can be sufficiently removed from the gap by the subsequent pressing step.

As a result, in the method of producing a shielded printed wiring board of the present invention, the printed wiring board, the first adhesive layer, and the second adhesive layer can be sufficiently adhered to each other.

In other words, since in the method of producing a shielded printed wiring board of the present invention, the first adhesive layer and the second adhesive layer are cured in two steps, the printed wiring board, the first adhesive layer, and the second adhesive layer can be sufficiently adhered to each other.

In the method of producing a shielded printed wiring board of the present invention, preferably, in the first electromagnetic wave shielding film preparing step and the second electromagnetic wave shielding film preparing step, a thickness of the first adhesive layer and a thickness of the second adhesive layer are controlled so that a sum of the thickness of the first adhesive layer of the first extending end portion and the thickness of the second adhesive layer of the second extending end portion after the subsequent pressing step is not smaller than one-thirtieth a thickness of the printed wiring board and not larger than the thickness of the printed wiring board.

Controlling the thickness of the first adhesive layer and/or the thickness of the second adhesive layer to fall within the above range achieves easiness of sufficient adhesion between the first adhesive layer and the second adhesive layer.

In the method of producing a shielded printed wiring board of the present invention, the first electromagnetic wave shielding film prepared in the first electromagnetic wave shielding film preparing step may include a first shielding layer between the first insulating layer and the first adhesive layer.

The first shielding layer may include metal or a first shielding layer conductive resin composition.

Such a first shielding layer can shield electromagnetic waves.

In the first electromagnetic wave shielding film prepared in the first electromagnetic wave shielding film preparing step in the method of producing a shielded printed wiring board of the present invention, the first adhesive layer may contain a first adhesive layer resin and first adhesive layer conductive particles and may have conductivity.

In the first electromagnetic wave shielding film prepared in the first electromagnetic wave shielding film preparing step in the method of producing a shielded printed wiring board of the present invention, the first insulating layer may be adhered to the first adhesive layer, and the first adhesive layer may contain a first adhesive layer resin and first adhesive layer conductive particles and may have conductivity and an electromagnetic wave shielding function.

In the first electromagnetic wave shielding film having such features, the first adhesive layer has both a function as an adhesive and an electromagnetic wave shielding function.

In the method of producing a shielded printed wiring board of the present invention, preferably, the weight percent of the first adhesive layer conductive particles in the first adhesive layer is 3 to 90% by weight.

When the weight percent of the first adhesive layer conductive particles is less than 3% by weight, sufficient shielding properties are less likely to be achieved.

When the weight percent of the first adhesive layer conductive particles is more than 90% by weight, the adhesion between the first adhesive layer and the second adhesive layer is likely to be low.

In the method of producing a shielded printed wiring board of the present invention, the printed circuit on the printed wiring board prepared in the printed wiring board preparing step may include a ground circuit, part of the ground circuit being exposed, and the pressurizing and heating in the subsequent pressing step may be performed so that the ground circuit is electrically connected to the first adhesive layer.

The printed wiring board having such a structure enables electrical connection between the ground circuit and the first adhesive layer.

In the method of producing a shielded printed wiring board of the present invention, the second electromagnetic wave shielding film prepared in the second electromagnetic wave shielding film preparing step may include a second shielding layer between the second insulating layer and the second adhesive layer.

The second shielding layer may include metal or a second shielding layer conductive resin composition.

Such a second shielding layer can shield electromagnetic waves.

In the second electromagnetic wave shielding film prepared in the second electromagnetic wave shielding film preparing step in the method of producing a shielded printed wiring board of the present invention, the second adhesive layer may contain a second adhesive layer resin and second adhesive layer conductive particles and may have conductivity.

In the second electromagnetic wave shielding film prepared in the second electromagnetic wave shielding film preparing step in the method of producing a shielded printed wiring board of the present invention, the second insulating layer may be adhered to the second adhesive layer, and the second adhesive layer may contain a second particles and may have conductivity and an electromagnetic wave shielding function.

In the second electromagnetic wave shielding film having such features, the second adhesive layer has both a function as an adhesive and an electromagnetic wave shielding function.

In the method of producing a shielded printed wiring board of the present invention, preferably, a weight percent of the second adhesive layer conductive particles in the second adhesive layer is 3 to 90% by weight.

When the weight percent of the second adhesive layer conductive particles is less than 3% by weight, sufficient shielding properties are less likely to be achieved.

When the weight percent of the second adhesive layer conductive particles is more than 90% by weight, the adhesion between the first adhesive layer and the second adhesive layer is likely to be low.

In the method of producing a shielded printed wiring board of the present invention, the printed circuit on the printed wiring board prepared in the printed wiring board preparing step may include a ground circuit, part of the ground circuit being exposed, and the pressurizing and heating in the subsequent pressing step may be performed so that the ground circuit is electrically connected to the second adhesive layer.

The printed wiring board having such a structure enables electrical connection between the ground circuit and the second adhesive layer.

In the method of producing a shielded printed wiring board of the present invention, preferably, the first insulating layer contains at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin.

Also preferably, the second insulating layer contains at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin.

In the initial pressing step and the subsequent pressing step in the method of producing a shielded printed wiring board of the present invention, high pressure is applied to the first extending end portion and the second extending end portion.

The first insulating layer and/or the second insulating layer containing any of the compositions can have high strength.

Thus, even when high pressure is applied to the first extending end portion and the second extending end portion in the initial pressing step and the subsequent pressing step, the first insulating layer and/or the second insulating layer are less likely to be damaged, for example.

In the method of producing a shielded printed wiring board of the present invention, preferably, the pressurizing and heating in the initial pressing step are performed at 0.2 to 0.7 MPa and 100° C. to 150° C. for 1 to 10 S.

When the pressurizing and heating are performed under the conditions within the above ranges in the initial pressing step, the first adhesive layer and the second adhesive layer are suitably semi-cured.

In the method of producing a shielded printed wiring board of the present invention, preferably, the pressurizing and heating in the subsequent pressing step are performed at 1 to 5 MPa and 150° C. to 190° C. for 60 s to 2 h.

When the pressurizing and heating are performed under the conditions within the above ranges in the subsequent pressing step, the air can be sufficiently removed from a gap between the first adhesive layer and the second adhesive layer, and the first adhesive layer and the second adhesive layer can be sufficiently cured.

A shielded printed wiring board of the present invention includes: a printed wiring board including a base film, a printed circuit formed on the base film, and a coverlay covering the printed circuit; a first insulating layer covering one face of the printed wiring board; and a second insulating layer covering the other face of the printed wiring board. Part of the first insulating layer protrudes from an end of the printed wiring board as a first insulating layer extending end portion, part of the second insulating layer protrudes from an end of the printed wiring board as a second insulating layer extending end portion, and the first insulating layer extending end portion faces the second insulating layer extending end portion. A space between the first insulating layer and the one face of the printed wiring board, a space between the second insulating layer and the other face of the printed wiring board, and a region where the first insulating layer extending end portion faces the second insulating layer extending end portion are filled with a conductive resin composition. A thickness of the conductive resin composition between the first insulating layer and the second insulating layer in the region where the first insulating layer extending end portion faces the second insulating layer extending end portion is not smaller than one-thirtieth a thickness of the printed wiring board and not larger than the thickness of the printed wiring board.

The method of producing a shielded printed wiring board of the present invention can produce the shielded printed wiring board of the present invention.

In particular, in the shielded printed wiring board of the present invention, the thickness of the conductive resin composition between the first insulating layer and the second insulating layer in the region where the first insulating layer extending end portion faces the second insulating layer extending end portion is not smaller than one-thirtieth a thickness of the printed wiring board and not larger than the thickness of the printed wiring board.

Thus, the region where the first insulating layer extending end portion faces the second insulating layer extending end portion is filled with a conductive resin composition without gaps.

Preferably, the shielded printed wiring board of the present invention includes a first shielding layer between the first insulating layer and the conductive resin composition. Preferably, the shielded printed wiring board of the present invention also includes a second shielding layer between the second insulating layer and the conductive resin composition.

The first shielding layer may include metal or the first shielding layer conductive resin composition. The second shielding layer may include metal or the second shielding layer conductive resin composition.

Such first shielding layer and second shielding layer formed can suitably shield electromagnetic waves.

In the shielded printed wiring board of the present invention, preferably, the conductive resin composition is an isotropic conductive resin composition.

When the conductive resin composition is an isotropic conductive resin composition, electromagnetic noise emitted from the printed wiring board can be effectively shielded.

In the shielded printed wiring board of the present invention, preferably, the conductive resin composition contains conductive particles and a resin, and a weight percent of the conductive particles is 3 to 90% by weight, more preferably 39 to 80% by weight.

When the weight percent of the conductive particles is less than 3% by weight, sufficient shielding properties are less likely to be achieved.

When the weight percent of the conductive particles is more than 90% by weight, the adhesive force of the conductive resin composition is likely to be low during production.

In the shielded printed wiring board of the present invention, preferably, the printed circuit on the printed wiring board includes a ground circuit, part of the ground circuit being exposed, and the ground circuit is electrically connected to the conductive resin composition.

The printed wiring board having such a structure enables electrical connection between the ground circuit and the conductive resin composition.

In the shielded printed wiring board of the present invention, preferably, the first insulating layer contains at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin.

Preferably, the second insulating layer contains at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin The first insulating layer and/or the second insulating layer containing any of the compositions can have high strength.

Thus, the first insulating layer and/or the second insulating layer are less likely to be damaged, for example.

Advantageous Effects of Invention

In the method of producing a shielded printed wiring board of the present invention, the first adhesive layer and the second adhesive layer are cured in two steps by the initial pressing step and the subsequent pressing step. Thus, the printed wiring board, the first adhesive layer, and the second adhesive layer can be sufficiently adhered to each other, and gaps can be prevented from being created between the first extending end portion and the second extending end portion.

DESCRIPTION OF EMBODIMENTS

The following specifically describes the method of producing a shielded printed wiring board of the present invention. The present invention is not limited to the following embodiments, and can be appropriately modified without changing the gist of the invention.

First Embodiment

A method of producing a shielded printed wiring board according to a first embodiment of the present invention, which is an example of the method of producing a shielded printed wiring board of the present invention, is described with reference to the drawings.

Figure 1:
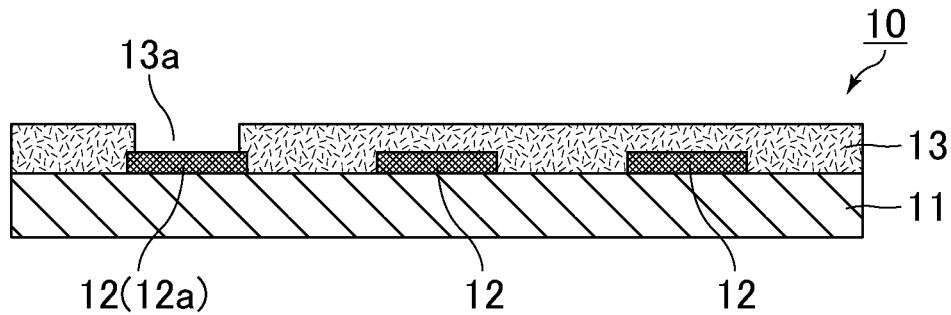
FIG. 1 is a view schematically showing an exemplary printed wiring board preparing step of a method of producing a shielded printed wiring board according to a first embodiment of the present invention.

FIG. 1 is a view schematically showing an exemplary printed wiring board preparing step of the method of producing a shielded printed wiring board according to the first embodiment of the present invention.

Figure 2:
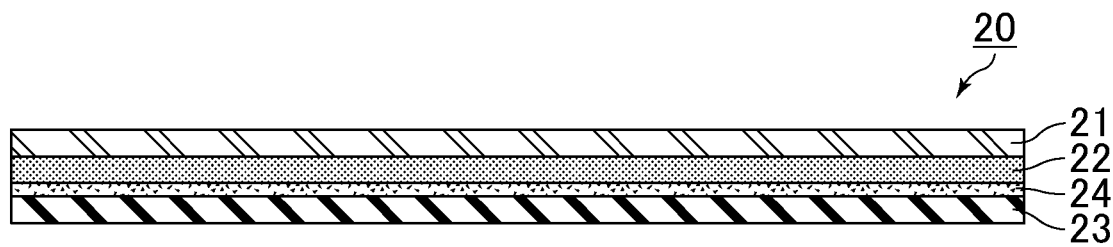
FIG. 2 is a view schematically showing an exemplary first electromagnetic wave shielding film preparing step of the method of producing a shielded printed wiring board according to the first embodiment of the present invention.

FIG. 2 is a view schematically showing an exemplary first electromagnetic wave shielding film preparing step of the method of producing a shielded printed wiring board according to the first embodiment of the present invention.

Figure 3:
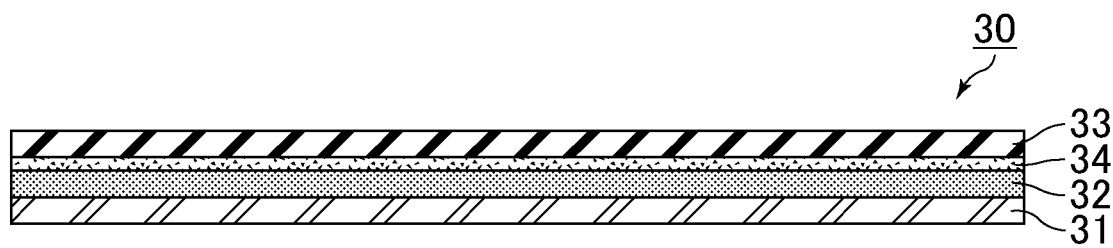
FIG. 3 is a view schematically showing an exemplary second electromagnetic wave shielding film preparing step of the method of producing a shielded printed wiring board according to the first embodiment of the present invention.

FIG. 3 is a view schematically showing an exemplary second electromagnetic wave shielding film preparing step of the method of producing a shielded printed wiring board according to the first embodiment of the present invention.

Figure 4:
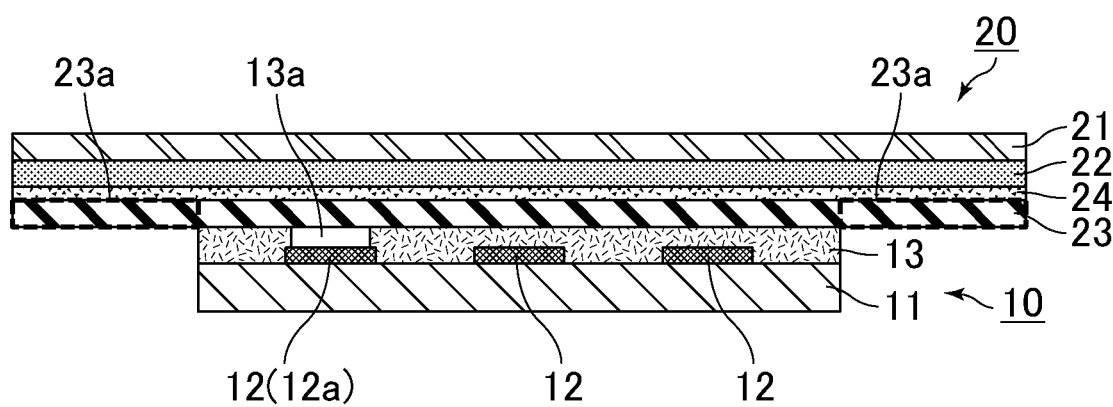
FIG. 4 is a view schematically showing an exemplary first electromagnetic wave shielding film placing step of the method of producing a shielded printed wiring board according to the first embodiment of the present invention.

FIG. 4 is a view schematically showing an exemplary first electromagnetic wave shielding film placing step of the method of producing a shielded printed wiring board according to the first embodiment of the present invention.

Figure 5:
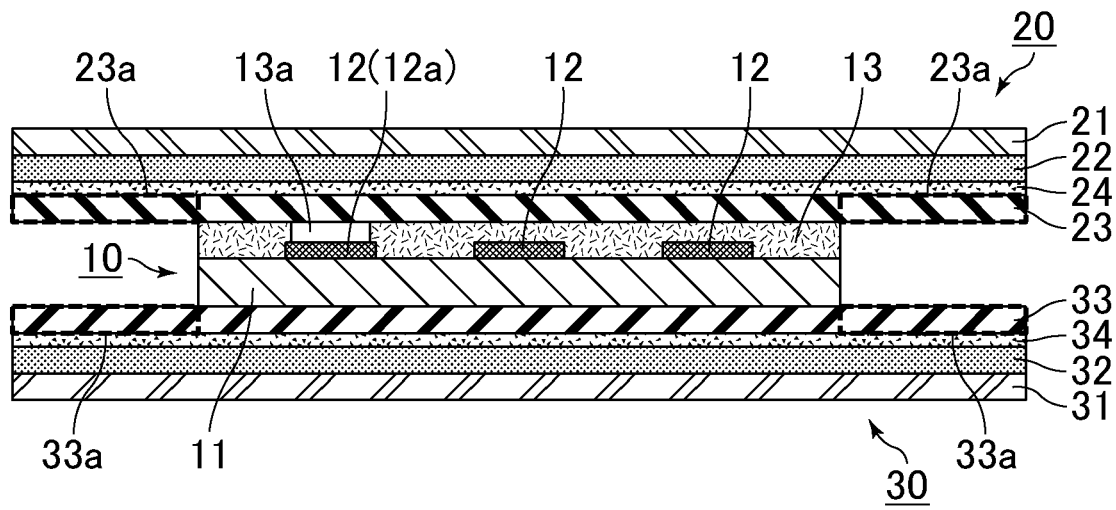
FIG. 5 is a view schematically showing an exemplary second electromagnetic wave shielding film placing step of the method of producing a shielded printed wiring board according to the first embodiment of the present invention.

FIG. 5 is a view schematically showing an exemplary second electromagnetic wave shielding film placing step of the method of producing a shielded printed wiring board according to the first embodiment of the present invention.

Figure 6:
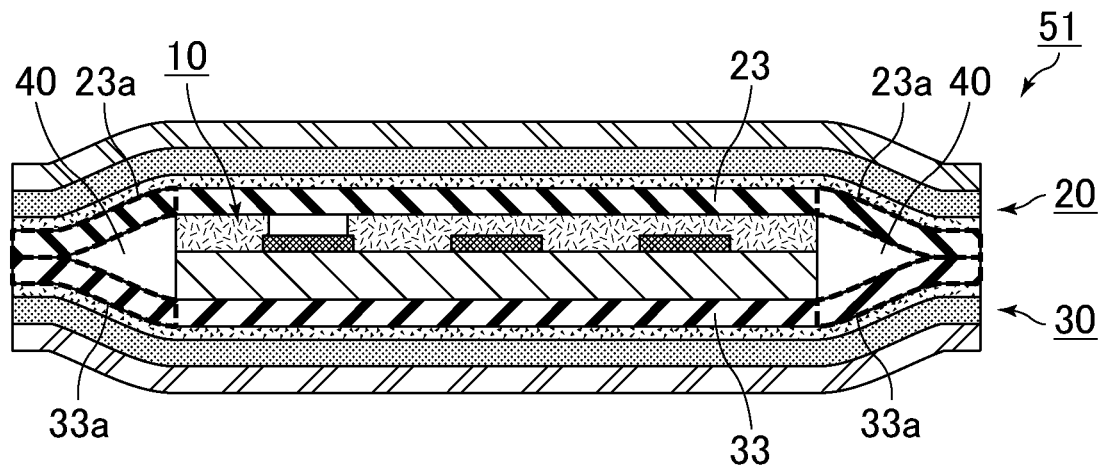
FIG. 6 is a view schematically showing an exemplary stacking step of the method of producing a shielded printed wiring board according to the first embodiment of the present invention.

FIG. 6 is a view schematically showing an exemplary stacking step of the method of producing a shielded printed wiring board according to the first embodiment of the present invention.

Figure 7:
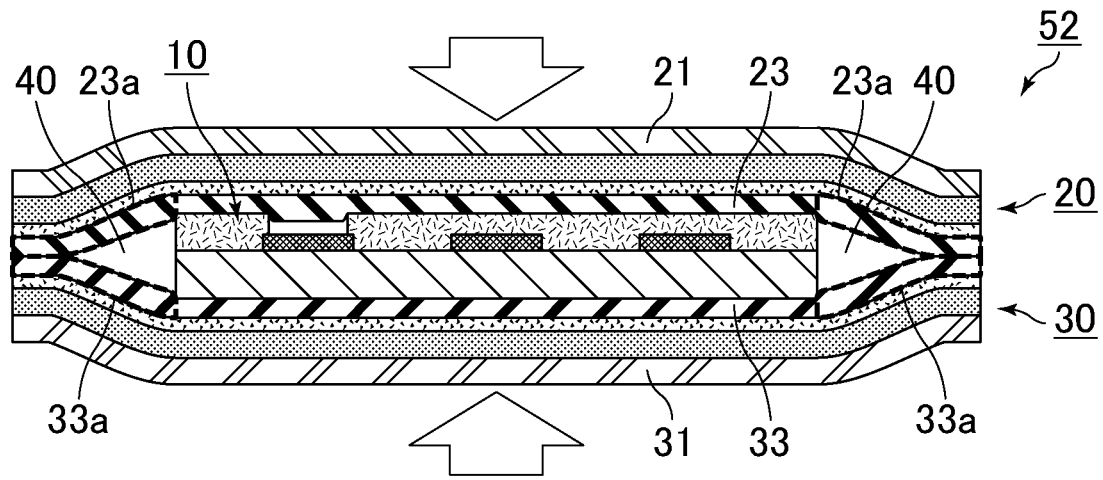
FIG. 7 is a view schematically showing an exemplary initial pressing step of the method of producing a shielded printed wiring board according to the first embodiment of the present invention.

FIG. 7 is a view schematically showing an exemplary initial pressing step of the method of producing a shielded printed wiring board according to the first embodiment of the present invention.

Figure 8:
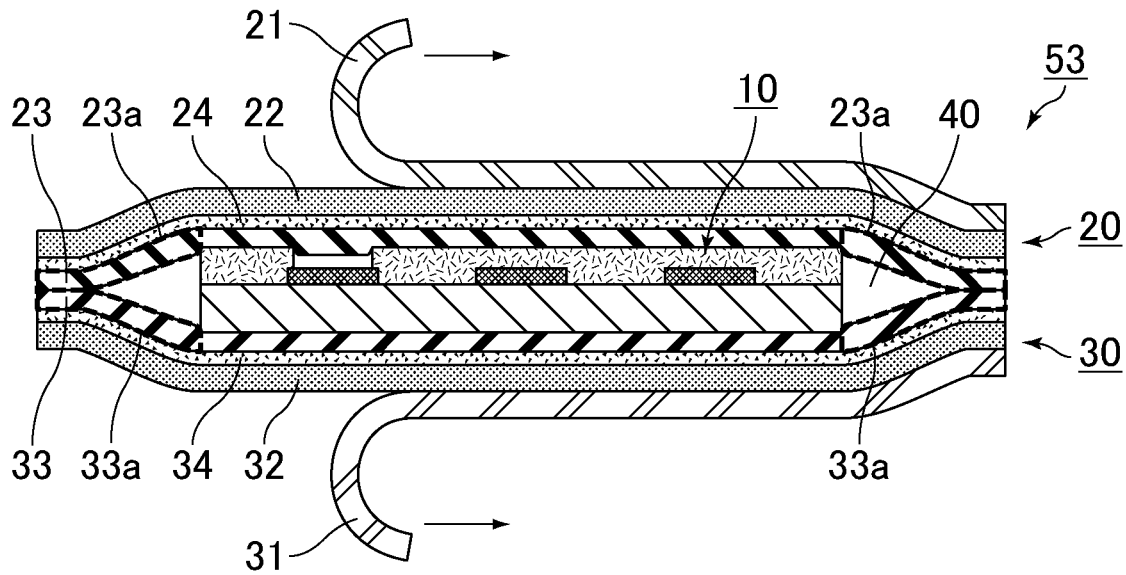
FIG. 8 is a view schematically showing an exemplary protective film peeling step of the method of producing a shielded printed wiring board according to the first embodiment of the present invention.

FIG. 8 is a view schematically showing an exemplary protective film peeling step of the method of producing a shielded printed wiring board according to the first embodiment of the present invention.

Figure 9A:
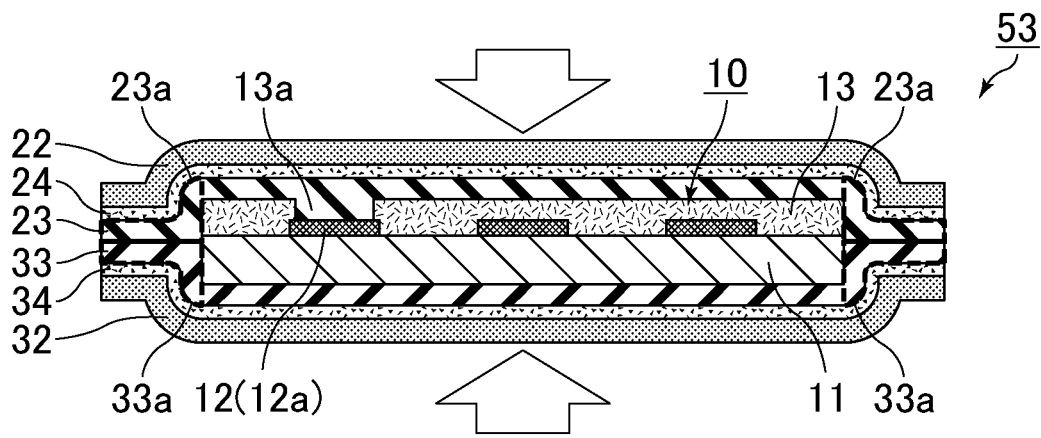
FIG. 9A is a view schematically showing an exemplary subsequent pressing step of the method of producing a shielded printed wiring board according to the first embodiment of the present invention.
Figure 9B:
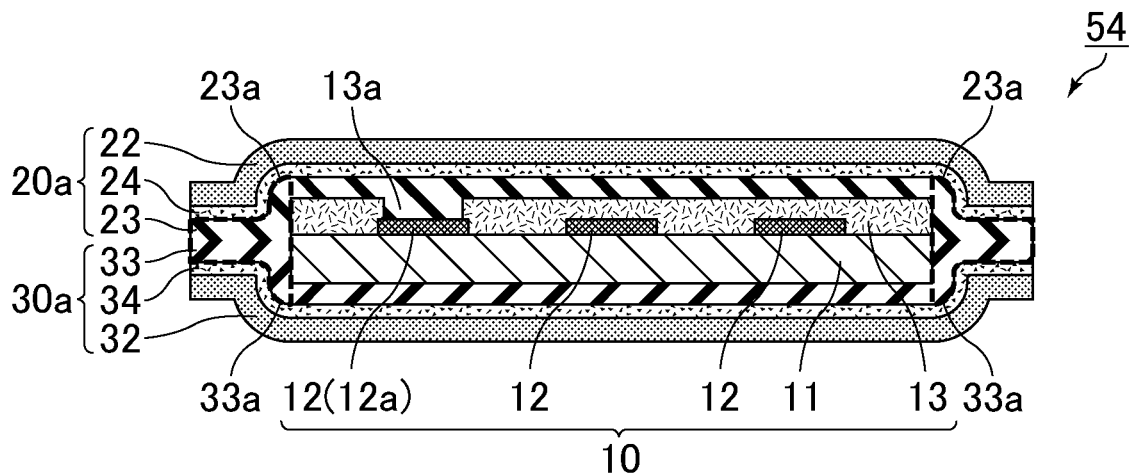
FIG. 9B is a view schematically showing an exemplary subsequent pressing step of the method of producing a shielded printed wiring board according to the first embodiment of the present invention.

FIG. 9A and FIG. 9B are views each schematically showing an exemplary subsequent pressing step of the method of producing a shielded printed wiring board according to the first embodiment of the present invention.

<Printed Wiring Board Preparing Step>

In this step, as shown in FIG. 1, a printed wiring board 10 including a base film 11, a printed circuit 12 formed on the base film 11, and a coverlay 13 covering the printed circuit 12 is prepared.

In the printed wiring board 10, the printed circuit 12 includes a ground circuit 12a.

The coverlay 13 includes an opening 13a where the ground circuit 12a is exposed.

(Base Film and Coverlay)

The base film 11 and the coverlay 13 may each be made of any material, and are each preferably made of engineering plastic. Examples of the engineering plastic include resins such as a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin.

Among these engineering plastics, a polyphenylene sulfide film is preferred for demand for flame retardancy, and a polyimide film is preferred for demand for heat resistance. The base film 11 preferably has a thickness of 10 to 40 µm, and the coverlay 13 preferably has a thickness of 10 to 30 µm.

The opening 13a may have any size, and preferably has a size of 0.03 to 320 mm$^2$, more preferably a size of 0.1 to 2.0 mm$^2$.

The opening 13a may have any shape, and may have a circular, elliptical, quadrangular, or triangular shape, for example.

(Printed Circuit)

The printed circuit 12 and the ground circuit 12a may each be made of any material. The material may be a known conductive material such as copper foil or a cured product of a conductive paste.

<First Electromagnetic Wave Shielding Film Preparing Step>

In this step, as shown in FIG. 2, a first electromagnetic wave shielding film 20 sequentially including a first protective film 21, a first insulating layer 22, a first shielding layer 24, and a first adhesive layer 23 is prepared.

The first electromagnetic wave shielding film 20 has a greater width than the printed wiring board 10. The first adhesive layer 23 contains a first adhesive layer resin and first adhesive layer conductive particles and has conductivity.

(First Protective Film)

The first protective film 21 may be made of any material, and may be, for example, a plastic sheet of polyethylene terephthalate, polyethylene naphthalate, polyvinyl fluoride, polyvinylidene fluoride, hard polyvinyl chloride, polyvinylidene chloride, nylon, polyimide, polystyrene, polyvinyl alcohol, an ethylene-vinyl alcohol copolymer, polycarbonate, polyacrylonitrile, polybutene, soft polyvinyl chloride, polyvinylidene fluoride, polyethylene, polypropylene, polyurethane, an ethylene-vinyl acetate copolymer, polyvinyl acetate, or the like; paper such as glassine paper, high-quality paper, kraft paper, or coated paper, any of a variety of non-woven fabrics, an artificial paper, a metal layer, or a composite film of a combination of these.

One or both faces of the first protective film 21 may be subjected to release treatment. The release treatment may be performed by applying a release agent to one or both faces of the film or by physically matting the film.

The first protective film 21 preferably has a thickness of 10 to 150 µm, more preferably 20 to 100 µm, still more preferably 40 to 60 µm.

When the thickness of the first protective film is smaller than 10 µm, the first protective film is easily broken and is not easily peeled off in the below-described protective film peeling step.

When the thickness of the first protective film is greater than 150 µm, the first protective film is difficult to handle.

(First Insulating Layer)

The first insulating layer 22 may include any material, and preferably includes at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin, more preferably includes a polyimide resin.

The first insulating layer 22 may consist of a single material or may include two or more materials.

The first insulating layer 22 may further contain additives such as curing accelerators, tackifiers, antioxidants, pigments, dyes, plasticizers, ultraviolet absorbers, defoamers, leveling agents, fillers, flame retardants, viscosity modifiers, and anti-blocking agents, if needed.

The first insulating layer 22 may have any thickness. The thickness may be designed as appropriate, and is preferably 1 to 15 μm, more preferably 3 to 10 μm.

When the thickness of the first insulating layer is smaller than 1 μm, the shielding film cannot conform to the steps of the printed wiring board, and thus the air is difficult to be removed from a gap in the following subsequent pressing step. Also, such a first insulating layer is too thin to sufficiently protect the first shielding layer and the first adhesive layer.

When the thickness of the first insulating layer is greater than 15 μm, the pressure is likely to be dispersed in the following subsequent pressing step, and thus the air is difficult to be removed from a gap. Also, such a first insulating layer is too thick to bend and is easily broken. Thus, the first insulating layer is difficult to apply to members that require bending resistance.

(First Shielding Layer)

The first shielding layer 24 may include any material as long as the layer shields electromagnetic waves, and may be made of metal or a first shielding layer conductive resin composition, for example.

When the first shielding layer 24 is made of metal, the metal may be gold, silver, copper, aluminum, nickel, tin, palladium, chromium, titanium, or zinc, for example. Preferred among these is copper. Copper is a material suitable for the first shielding layer in terms of conductivity and economic efficiency.

The first shielding layer 24 may be made of an alloy of any of the above metals.

The first shielding layer 24 may be metal foil or a metal film formed by a method such as sputtering, electroless plating, or electrolytic plating.

When the first shielding layer 24 is made of metal, the first shielding layer preferably has a thickness of 0.01 μm or greater, more preferably 0.1 μm or greater, still more preferably 0.5 μm or greater, in order to ensure sufficient shielding properties. In order to reduce the thickness of the shielded printed wiring board, the thickness of the first shielding layer is preferably 20 μm or smaller, more preferably 15 μm or smaller, still more preferably 10 μm or smaller.

When the first shielding layer 24 is made of the first shielding layer conductive resin composition, the first shielding layer 24 may contain conductive particles and a resin.

Non-limiting examples of the conductive particles include fine metal particles, carbon nanotubes, carbon fibers, and metal fibers.

When the conductive particles are fine metal particles, the fine metal particles may be any powder or particles such as silver powder, copper powder, nickel powder, solder powder, aluminum powder, silver-coated copper powder (silver-plated copper powder), or fine particles such as fine polymer particles or glass beads coated with metal.

In terms of economic efficiency, preferred among these is copper powder or silver-plated copper powder which is available at low costs.

The conductive particles may have any average particle size, and the average particle size is preferably 0.5 to 15.0 μm. When the average particle size of the conductive particles is 0.5 μm or greater, the first shielding layer conductive resin composition has good conductivity. When the average particle size of the conductive particles is 15.0 μm or smaller, the thickness of the first shielding layer 24 made of the first shielding layer conductive resin composition can be small.

The conductive particles may have any shape and may be appropriately selected from spherical, flat, scale-like, dendrite, rod-like, and fibrous particles.

The amount of the conductive particles may be any amount and is preferably 15 to 90% by weight, more preferably 15 to 60% by weight.

Non-limiting examples of the resin include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition; and thermosetting resin compositions such as a phenolic resin composition, an epoxy resin composition, a urethane resin composition, a melamine resin composition, and an alkyd resin composition.

(First Adhesive Layer)

The first adhesive layer 23 contains the first adhesive layer resin and the first adhesive layer conductive particles.

The first adhesive layer resin may include a thermosetting resin or a thermoplastic resin.

Examples of the thermosetting resin include a phenolic resin, an epoxy resin, a urethane resin, a melamine resin, a polyamide resin, and an alkyd resin.

Examples of the thermoplastic resin include a styrene resin, a vinyl acetate resin, a polyester resin, a polyethylene resin, a polypropylene resin, an imide resin, and an acrylic resin.

Preferably, the epoxy resin is an amide-modified epoxy resin.

These resins are suitable as a resin in the first adhesive layer 23.

Non-limiting examples of the first adhesive layer conductive particles include fine metal particles, carbon nanotubes, carbon fibers, and metal fibers.

When the first adhesive layer conductive particles are fine metal particles, the fine metal particles may be any powder or particles such as silver powder, copper powder, nickel powder, solder powder, aluminum powder, silver-coated copper powder (silver-plated copper powder), or fine particles such as fine polymer particles or glass beads coated with metal.

In terms of economic efficiency, preferred among these is copper powder or silver-coated copper powder which is available at low costs.

The first adhesive layer conductive particles may have any average particle size, and the average particle size is preferably 0.5 to 15.0 μm. When the average particle size of the first adhesive layer conductive particles is 0.5 μm or greater, the first adhesive layer has good conductivity. When the average particle size of the conductive particles is 15.0 μm or smaller, the thickness of the first adhesive layer can be small.

The first adhesive layer conductive particles may have any shape and may be appropriately selected from spherical, flat, scale-like, dendrite, rod-like, and fibrous particles.

The weight percent of the first adhesive layer conductive particles in the first adhesive layer is preferably 3 to 90% by weight, more preferably 39 to 90% by weight.

When the weight percent of the first adhesive layer conductive particles is less than 3% by weight, sufficient shielding properties are less likely to be achieved.

When the weight percent of the first adhesive layer conductive particles is more than 90% by weight, the adhesion between the first adhesive layer and the second adhesive layer is likely to be low.

When the weight percent of the first adhesive layer conductive particles is 39 to 90% by weight, the first adhesive layer has isotropic conductivity.

The first adhesive layer 23 may have any thickness, and the thickness is preferably 1 to 50 µm, more preferably 3 to 30 µm.

When the thickness of the first adhesive layer is smaller than 1 µm, the amount of the resin in the first adhesive layer is small, and thus sufficient adhesion is less likely to be obtained. Also, the first adhesive layer is easily broken.

When the thickness of the first adhesive layer is greater than 50 µm, the first adhesive layer has a large thickness as a whole and has poor flexibility. Thus, the region where the first extending end portion faces the second extending end portion is easily broken.

Preferably, the first adhesive layer 23 is an isotropic conductive resin composition.

When the first adhesive layer 23 is an isotropic conductive resin composition, the first adhesive layer 23 can effectively shield electromagnetic noise emitted from the printed wiring board.

As described later, the first adhesive layer 23 is electrically connected to the ground circuit 12a. The first electromagnetic wave shielding film 20 may include an anchor coat layer between the first insulating layer 22 and the first shielding layer 24.

Examples of a material of the anchor coat layer include a urethane resin, an acrylic resin, a core-shell composite resin containing a urethane resin as the shell and an acrylic resin as the core, an epoxy resin, an imide resin, an amide resin, a melamine resin, a phenolic resin, a urea formaldehyde resin, a blocked isocyanate obtained by reacting polyisocyanate with blocking agents such as phenol, polyvinyl alcohol, and polyvinylpyrrolidone.

<Second Electromagnetic Wave Shielding Film Preparing Step>

In this step, as shown in FIG. 3, a second electromagnetic wave shielding film 30 sequentially including a second protective film 31, a second insulating layer 32, a second shielding layer 34, and a second adhesive layer 33 is prepared.

The second electromagnetic wave shielding film 30 has a greater width than the printed wiring board 10.

The second adhesive layer 33 contains a second particles and has conductivity.

Preferred constitutions of the second protective film 31, the second insulating layer 32, the second shielding layer 34, and the second adhesive layer 33 (the second adhesive layer resin and the second adhesive layer conductive particles) in the second electromagnetic wave shielding film 30 are the same as the preferred constitutions of the first protective film 21, the first insulating layer 22, the first shielding layer 24, and the first adhesive layer 23 (the first adhesive layer resin and the first adhesive layer conductive particles) in the first electromagnetic wave shielding film 20.

<First Electromagnetic Wave Shielding Film Placing Step>

In this step, as shown in FIG. 4, the first electromagnetic wave shielding film 20 is placed on the printed wiring board 10 so that the first adhesive layer 23 is in contact with a coverlay 13-side surface of the printed wiring board 10.

The ends of the first adhesive layer 23 protrude from the respective ends of the printed wiring board 10 to form first extending end portions 23a.

<Second Electromagnetic Wave Shielding Film Placing Step>

In this step, as shown in FIG. 5, the second electromagnetic wave shielding film 30 is placed on the printed wiring board 10 so that the second adhesive layer 33 is in contact with a base film 11-side surface of the printed wiring board 10.

The ends of the second adhesive layer 33 protrude from the respective ends of the printed wiring board 10 to form second extending end portions 33a.

<Stacking Step>

In this step, as shown in FIG. 6, the first adhesive layer 23 is stacked on the second adhesive layer 33 so that gaps 40 are created between the first extending end portions 23a of the first adhesive layer 23 at the ends of the first electromagnetic wave shielding film 20 and the second extending end portions 33a of the second adhesive layer 33 at the ends of the second electromagnetic wave shielding film 30, whereby a first intermediate product 51 is prepared.

In the method of producing a shielded printed wiring board of the present invention, as described later, the first adhesive layer 23 and the second adhesive layer 33 are cured in two steps by the initial pressing step and the subsequent pressing step.

Even when the gaps 40 are created between the first extending end portions 23a and the second extending end portions 33a in the stacking step, these steps can remove the air from the gaps 40 and achieve sufficient adhesion between the first adhesive layer 23 and the second adhesive layer 33.

If the first adhesive layer is stacked on the second adhesive layer without creating such gaps in the stacking step, the stacking requires high pressure and takes a long time, resulting in poor productivity.

<Initial Pressing Step>

In this step, as shown in FIG. 7, the first intermediate product 51 is pressurized and heated from a first protective film 21 side and a second protective film 31 side to the extent that the first adhesive layer 23 and the second adhesive layer 33 are not completely cured, whereby a second intermediate product 52 is prepared.

In the initial pressing step, the pressurizing and heating are performed to the extent that the first adhesive layer 23 and the second adhesive layer 33 are not completely cured. In other words, in the initial pressing step, the first adhesive layer 23 and the second adhesive layer 33 are semi-cured.

The semi-curing the first adhesive layer 23 and the second adhesive layer 33 can fix the positions of the first electromagnetic wave shielding film 20 and the second electromagnetic wave shielding film 30.

Thus, in the below-described protective film peeling step, the first protective film 21 and the second protective film 31 are easily peeled off.

In addition, since pressure and heat are applied through the first protective film 21 and the second protective film 31, the pressure can be uniformly applied to the first intermediate product.

In addition, in the below-described subsequent pressing step, the air can be easily removed from the gaps 40 between the first adhesive layer 23 and the second adhesive layer 33.

The pressurizing and heating in the initial pressing step may be performed under the following conditions.

Specifically, the pressure is preferably 0.2 to 0.7 MPa, more preferably 0.3 to 0.6 MPa.

The temperature is preferably 100° C. to 150° C., more preferably 110° C. to 130° C.

The time is preferably 1 to 10 s, more preferably 3 to 7 s.

Under the pressurizing and heating conditions of the initial pressing step within the above ranges, the first adhesive layer 23 and the second adhesive layer 33 can be suitably semi-cured.

<Protective Film Peeling Step>

In this step, as shown in FIG. 8, the first protective film 21 and the second protective film 31 are peeled off from the second intermediate product 52, whereby a third intermediate product 53 is prepared.

<Subsequent Pressing Step>

In this step, as shown in FIG. 9A, the third intermediate product 53 is pressurized and heated from a first insulating layer 22 side and a second insulating layer 32 side to cure the first adhesive layer 23 and the second adhesive layer 33.

Through this step, the air is removed from the gaps 40 between the first adhesive layer 23 and the second adhesive layer 33, the opening 13a is filled with the first adhesive layer 23, and the first adhesive layer 23 is in contact with the ground circuit 12a.

If the first protective film 21 and the second protective film 31 are not peeled off in the protective film peeling step before the subsequent pressing step, the pressure is absorbed and the air is not easily removed from the gaps 40 between the first adhesive layer 23 and the second adhesive layer 33.

In the method of producing a shielded printed wiring board according to the first embodiment of the present invention, the first protective film 21 and the second protective film 31 are peeled off before the subsequent pressing step. Thus, the pressure is less likely to be absorbed in the subsequent pressing step. Accordingly, even when the gaps 40 are present between the first adhesive layer 23 and the second adhesive layer 33, the air can be sufficiently removed from the gaps 40 by the subsequent pressing step.

As a result, the printed wiring board 10, the first adhesive layer 23, and the second adhesive layer 33 can be sufficiently adhered to each other.

The pressurizing and heating in the subsequent pressing step may be performed under the following conditions.

Specifically, the pressure is preferably 1 to 5 MPa, more preferably 2 to 4 MPa.

The temperature is preferably 150° C. to 190° C., more preferably 160° C. to 190° C., still more preferably 165° C. to 180° C.

The time is preferably 60 s to 2 h, more preferably 120 s to 1 h, still more preferably 180 s to 0.5 h.

Under the pressurizing and heating conditions of the subsequent pressing step within the above ranges, the air can be sufficiently removed from the gaps 40 between the first adhesive layer 23 and the second adhesive layer 33, and the first adhesive layer 23 and the second adhesive layer 33 can be sufficiently cured.

In the first electromagnetic wave shielding film preparing step and the second electromagnetic wave shielding film preparing step in the method of producing a shielded printed wiring board according to the first embodiment of the present invention, preferably, the thickness of the first adhesive layer and the thickness of the second adhesive layer are controlled so that the sum of the thickness of the first adhesive layer of the first extending end portion and the thickness of the second adhesive layer of the second extending end portion after the subsequent pressing step is not smaller than one-thirtieth the thickness of the printed wiring board and not larger than the thickness of the printed wiring board. More preferably, the thickness of the first adhesive layer and the thickness of the second adhesive layer are controlled so that the sum is one-twentieth to nine-tenth the thickness of the printed wiring board, and still more preferably, the thickness of the first adhesive layer and the thickness of the second adhesive layer are controlled so that the sum is one-fifteenth to nine-tenth the thickness of the printed wiring board.

Controlling the thickness of the first adhesive layer and/or the thickness of the second adhesive layer to fall within the above ranges achieves easiness of sufficient adhesion between the first adhesive layer and the second adhesive layer.

When the sum of the thickness of the first adhesive layer of the first extending end portion and the thickness of the second adhesive layer of the second extending end portion after the subsequent pressing step is smaller than one-thirtieth the thickness of the printed wiring board, a gap is likely to be created between the first adhesive layer and the second adhesive layer.

When the sum of the thickness of the first adhesive layer of the first extending end portion and the thickness of the second adhesive layer of the second extending end portion after the subsequent pressing step is larger than the thickness of the printed wiring board, the shielded printed wiring board has a large thickness. This is not preferred in terms of reducing the thickness of the shielded printed wiring board.

Through the above-described steps, a shielded printed wiring board 54 can be produced as shown in FIG. 9B.

The shielded printed wiring board 54 shown in FIG. 9B includes the printed wiring board 10, a first electromagnetic wave shielding portion 20a placed on the upper side of the printed wiring board 10, and a second electromagnetic wave shielding portion 30a placed on the lower side of the printed wiring board 10.

The first electromagnetic wave shielding portion 20a is formed through curing the adhesive layer of the first electromagnetic wave shielding film, and the second electromagnetic wave shielding portion 30a is formed through curing the adhesive layer of the second electromagnetic wave shielding film.

The printed wiring board 10 includes the base film 11, the printed circuit 12 including the ground circuit 12a formed on the base film 11, and the coverlay 13 covering the printed circuit 12, and the coverlay 13 includes the opening 13a where the ground circuit 12a is exposed.

The first electromagnetic wave shielding portion 20a sequentially includes the first insulating layer 22, the first shielding layer 24, and the first adhesive layer 23.

The first adhesive layer 23 is in contact with the coverlay 13.

The opening 13a of the coverlay 13 is filled with the first adhesive layer 23, and the first adhesive layer 23 is in contact with the ground circuit 12a.

The second electromagnetic wave shielding portion 30a sequentially includes the second insulating layer 32, the second shielding layer 34, and the second adhesive layer 33.

The second adhesive layer 33 is in contact with the base film 11.

In the shielded printed wiring board 54, the first electromagnetic wave shielding portion 20a has a greater width than the printed wiring board 10, and the ends of the first adhesive layer 23 of the first electromagnetic wave shielding portion 20a protrude from the respective ends of the printed wiring board 10 as the first extending end portions 23a.

Also in the shielded printed wiring board 54, the second electromagnetic wave shielding portion 30a has a greater width than the printed wiring board 10, and the ends of the second electromagnetic wave shielding portion 30a protrude from the respective ends of the printed wiring board 10 as the second extending end portions 33a.

The first adhesive layer 23 at the first extending end portions 23a is adhered to the second adhesive layer 33 at the second extending end portions 33a.

In the shielded printed wiring board, the first adhesive layer at the first extending end portion and the second adhesive layer at the second extending end portion are so integrated that the boundary cannot be identified. In FIG. 9B, for convenience, the first adhesive layer 23 at the first extending end portions 23a and the second adhesive layer 33 at the second extending end portions 33a are illustrated as different areas.

Second Embodiment

Next, a method of producing a shielded printed wiring board according to a second embodiment of the present invention, which is an example of the method of producing a shielded printed wiring board of the present invention, is described.

Figure 10:
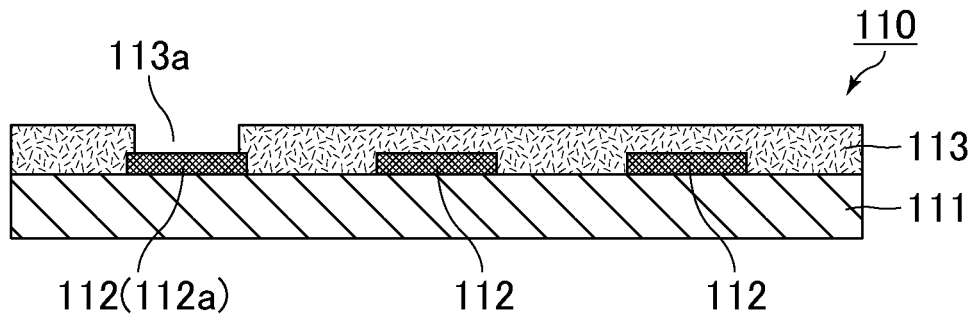
FIG. 10 is a view schematically showing an exemplary printed wiring board preparing step of a method of producing a shielded printed wiring board according to a second embodiment of the present invention.

FIG. 10 is a view schematically showing an exemplary printed wiring board preparing step of the method of producing a shielded printed wiring board according to the second embodiment of the present invention.

Figure 11:
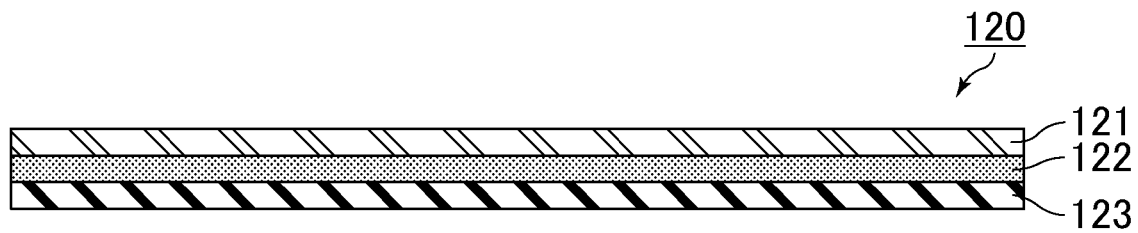
FIG. 11 is a view schematically showing an exemplary first electromagnetic wave shielding film preparing step of the method of producing a shielded printed wiring board according to the second embodiment of the present invention.

FIG. 11 is a view schematically showing an exemplary first electromagnetic wave shielding film preparing step of the method of producing a shielded printed wiring board according to the second embodiment of the present invention.

Figure 12:
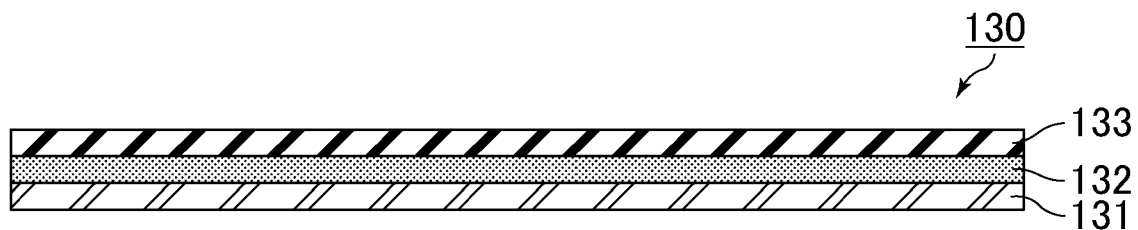
FIG. 12 is a view schematically showing an exemplary second electromagnetic wave shielding film preparing step of the method of producing a shielded printed wiring board according to the second embodiment of the present invention.

FIG. 12 is a view schematically showing an exemplary second electromagnetic wave shielding film preparing step of the method of producing a shielded printed wiring board according to the second embodiment of the present invention.

Figure 13:
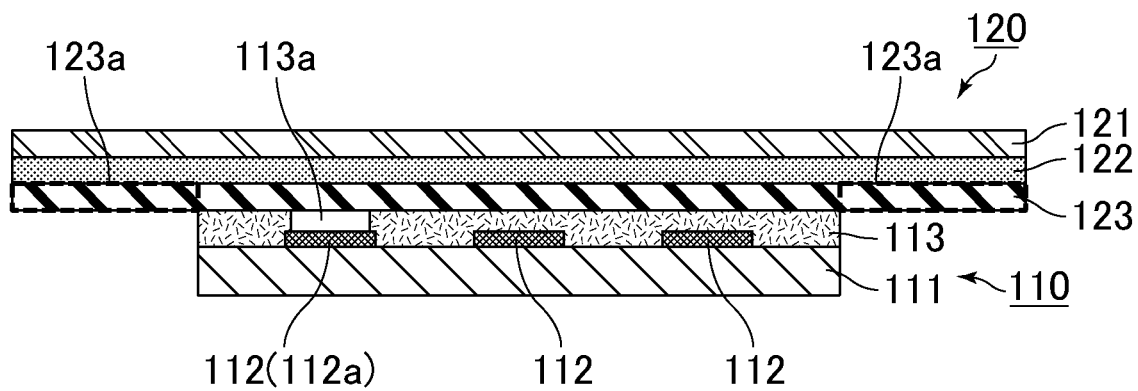
FIG. 13 is a view schematically showing an exemplary first electromagnetic wave shielding film placing step of the method of producing a shielded printed wiring board according to the second embodiment of the present invention.

FIG. 13 is a view schematically showing an exemplary first electromagnetic wave shielding film placing step of the method of producing a shielded printed wiring board according to the second embodiment of the present invention.

Figure 14:
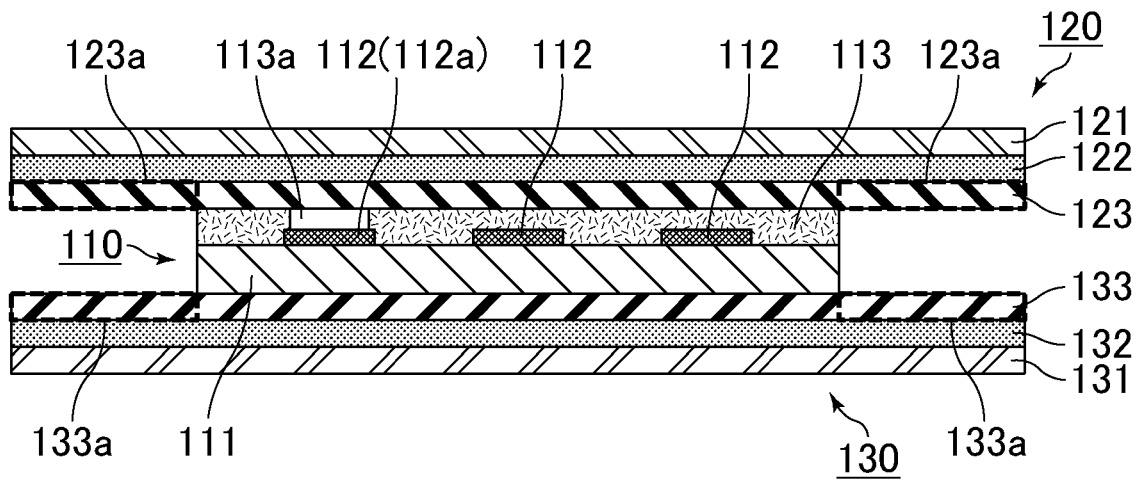
FIG. 14 is a view schematically showing an exemplary second electromagnetic wave shielding film placing step of the method of producing a shielded printed wiring board according to the second embodiment of the present invention.

FIG. 14 is a view schematically showing an exemplary second electromagnetic wave shielding film placing step of the method of producing a shielded printed wiring board according to the second embodiment of the present invention.

Figure 15:
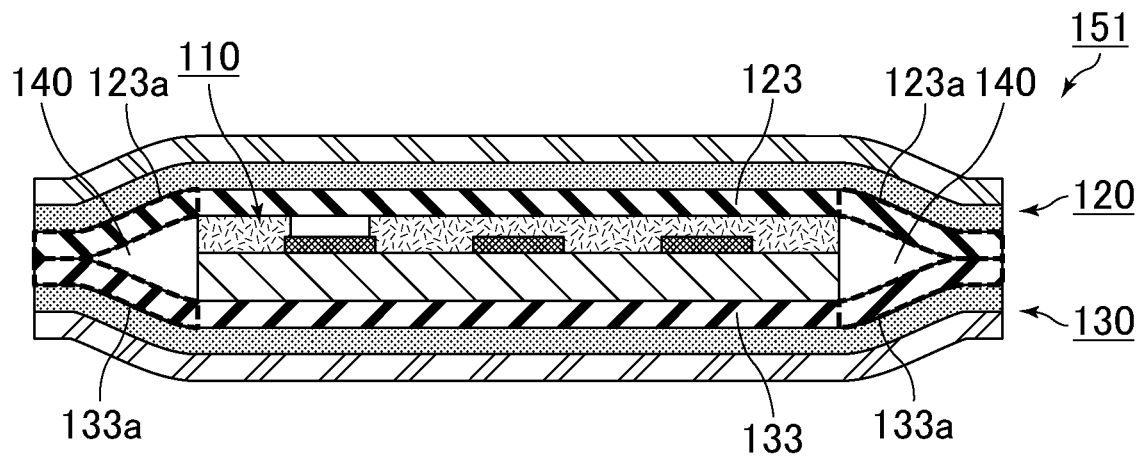
FIG. 15 is a view schematically showing an exemplary stacking step of the method of producing a shielded printed wiring board according to the second embodiment of the present invention.

FIG. 15 is a view schematically showing an exemplary stacking step of the method of producing a shielded printed wiring board according to the second embodiment of the present invention.

Figure 16:
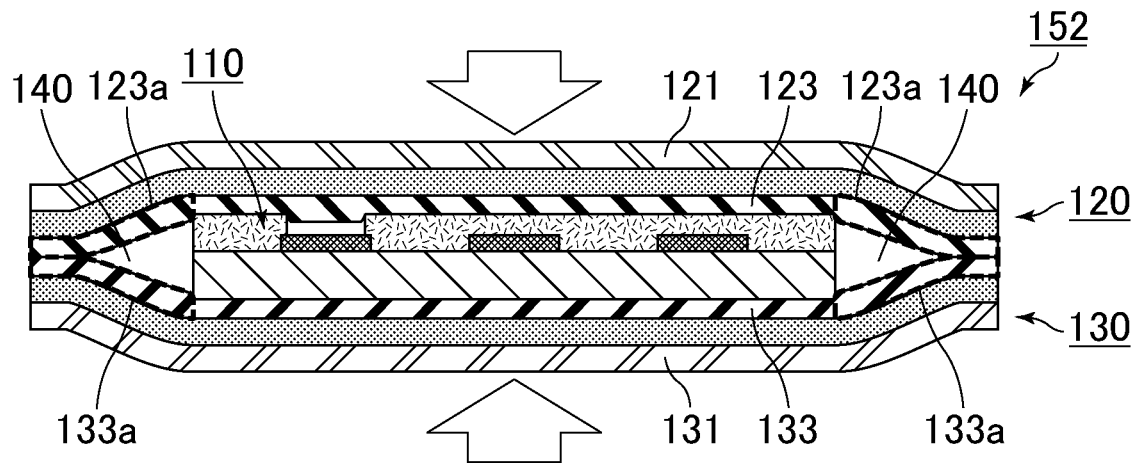
FIG. 16 is a view schematically showing an exemplary initial pressing step of the method of producing a shielded printed wiring board according to the second embodiment of the present invention.

FIG. 16 is a view schematically showing an exemplary initial pressing step of the method of producing a shielded printed wiring board according to the second embodiment of the present invention.

Figure 17:
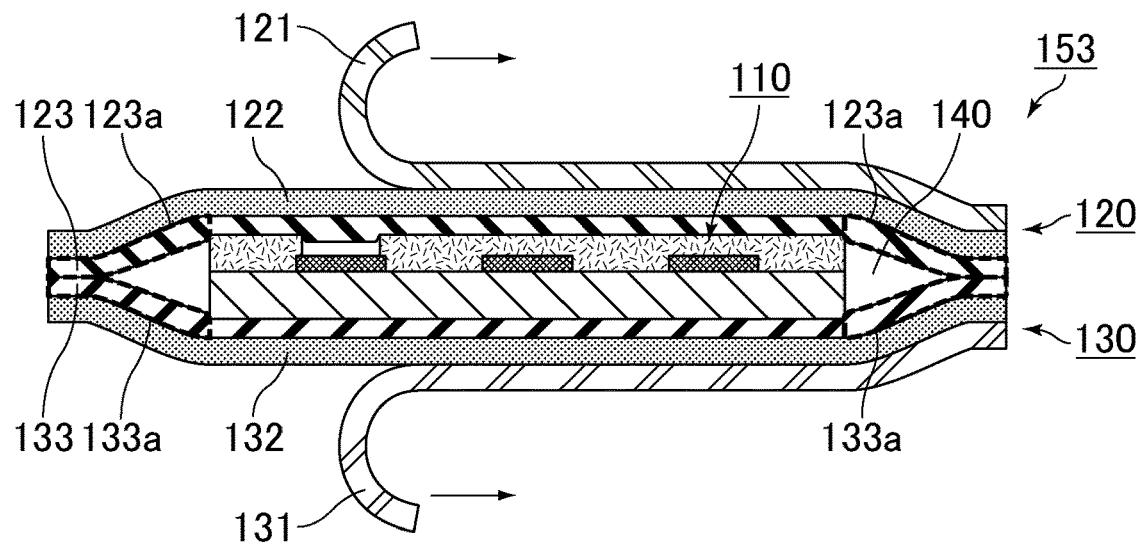
FIG. 17 is a view schematically showing an exemplary protective film peeling step of the method of producing a shielded printed wiring board according to the second embodiment of the present invention.

FIG. 17 is a view schematically showing an exemplary protective film peeling step of the method of producing a shielded printed wiring board according to the second embodiment of the present invention.

Figure 18A:
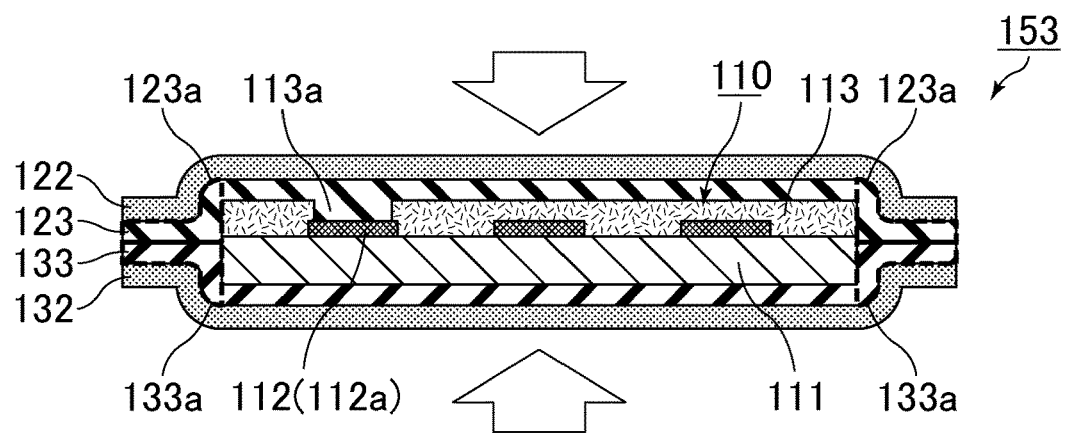
FIG. 18A is a view schematically showing an exemplary subsequent pressing step of the method of producing a shielded printed wiring board according to the second embodiment of the present invention.
Figure 18B:
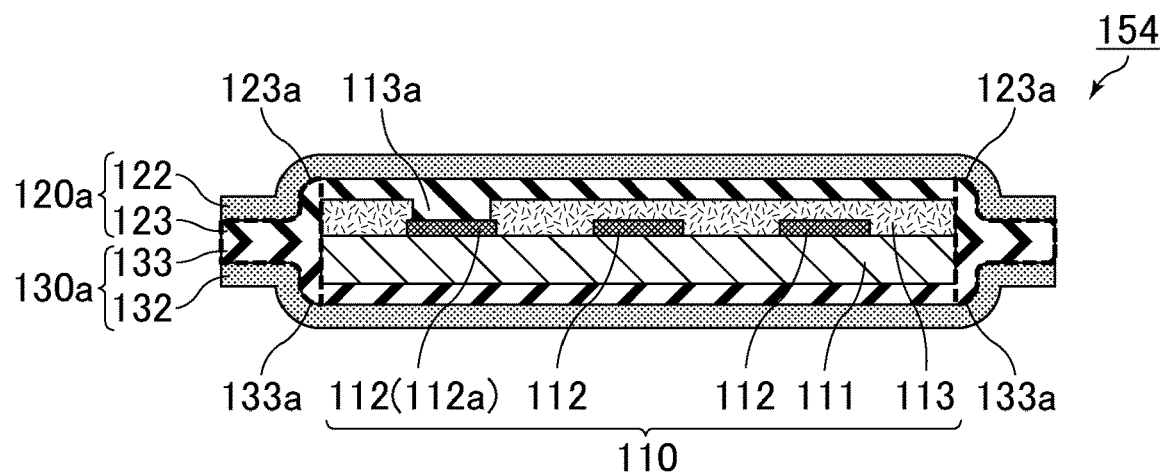
FIG. 18B is a view schematically showing an exemplary subsequent pressing step of the method of producing a shielded printed wiring board according to the second embodiment of the present invention.

FIG. 18A and FIG. 18B are views each schematically showing an exemplary subsequent pressing step of the method of producing a shielded printed wiring board according to the second embodiment of the present invention.

<Printed Wiring Board Preparing Step>

In this step, as shown in FIG. 10, a printed wiring board 110 including a base film 111, a printed circuit 112 formed on the base film 111, and a coverlay 113 covering the printed circuit 112 is prepared.

In the printed wiring board 110, the printed circuit 112 includes a ground circuit 112a.

The coverlay 113 includes an opening 113a where the ground circuit 112a is exposed.

Preferred materials and the like of the base film 111, the printed circuit 112, and the coverlay 113 in the printed wiring board 110 prepared in this step are the same as the preferred materials and the like of the base film 11, the printed circuit 12, and the coverlay 13 in the method of producing a shielded printed wiring board according to the first embodiment of the present invention.

<First Electromagnetic Wave Shielding Film Preparing Step>

In this step, as shown in FIG. 11, a first electromagnetic wave shielding film 120 sequentially including a first protective film 121, a first insulating layer 122, and a first adhesive layer 123 is prepared. The first electromagnetic wave shielding film 120 has a greater width than the printed wiring board 110.

Preferred materials and the like of the first protective film 121 and the first insulating layer 122 are the same as the preferred materials and the like of the first protective film 21 and the first insulating layer 22 in the method of producing a shielded printed wiring board according to the first embodiment of the present invention.

The first adhesive layer 123 contains a first adhesive layer resin and first adhesive layer conductive particles and has conductivity and an electromagnetic wave shielding function. In other words, the first adhesive layer 123 has both a function as an adhesive and an electromagnetic wave shielding function.

The first adhesive layer resin may include a thermosetting resin or a thermoplastic resin.

Examples of the thermosetting resin include a phenolic resin, an epoxy resin, a urethane resin, a melamine resin, a polyamide resin, and an alkyd resin.

Examples of the thermoplastic resin include a styrene resin, a vinyl acetate resin, a polyester resin, a polyethylene resin, a polypropylene resin, an imide resin, and an acrylic resin.

Preferably, the epoxy resin is an amide-modified epoxy resin.

These resins are suitable as a resin in the first adhesive layer 123.

Non-limiting examples of the first adhesive layer conductive particles include fine metal particles, carbon nanotubes, carbon fibers, and metal fibers.

When the first adhesive layer conductive particles are fine metal particles, the fine metal particles may be any powder or particles such as silver powder, copper powder, nickel powder, solder powder, aluminum powder, silver-coated copper powder (silver-plated copper powder), or fine particles such as fine polymer particles or glass beads coated with metal.

In terms of economic efficiency, preferred among these is copper powder or silver-coated copper powder which can be available at low costs.

The first adhesive layer conductive particles may have any average particle size, and the average particle size is preferably 0.5 to 15.0 μm. When the average particle size of the first adhesive layer conductive particles is 0.5 μm or greater, the first adhesive layer has good conductivity. When the average particle size of the conductive particles is 15.0 μm or smaller, the thickness of the first adhesive layer can be small.

The first adhesive layer conductive particles may have any shape and may be appropriately selected from spherical, flat, scale-like, dendrite, rod-like, and fibrous particles.

The weight percent of the first adhesive layer conductive particles in the first adhesive layer is preferably 3 to 90% by weight, more preferably 39 to 90% by weight.

When the weight percent of the first adhesive layer conductive particles is less than 3% by weight, sufficient shielding properties are less likely to be achieved.

When the weight percent of the first adhesive layer conductive particles is more than 90% by weight, the adhesion between the first adhesive layer and the second adhesive layer is likely to be low.

When the weight percent of the first adhesive layer conductive particles is 39 to 90% by weight, the first adhesive layer has isotropic conductivity.

The first adhesive layer 123 may have any thickness, and the thickness is preferably 1 to 50 µm, more preferably 3 to 30 µm.

When the thickness of the first adhesive layer is smaller than 1 µm, the amount of the resin in the first adhesive layer is small, and thus sufficient adhesion is less likely to be obtained. Also, the first adhesive layer is easily broken.

When the thickness of the first adhesive layer is greater than 50 µm, the first adhesive layer has a large thickness as a whole and is likely to lose flexibility.

<Second Electromagnetic Wave Shielding Film Preparing Step>

In this step, as shown in FIG. 12, a second electromagnetic wave shielding film 130 sequentially including a second protective film 131, a second insulating layer 132, and a second adhesive layer 133 is prepared. The second electromagnetic wave shielding film 130 has a greater width than the printed wiring board 110.

Preferred materials and the like of the second protective film 131 and the second insulating layer 132 are the same as the preferred materials and the like of the second protective film 31 and the second insulating layer 32 in the method of producing a shielded printed wiring board according to the first embodiment of the present invention.

The second adhesive layer 133 contains a second adhesive layer resin and second adhesive layer conductive particles and has conductivity and an electromagnetic wave shielding function. In other words, the second adhesive layer 133 has both a function as an adhesive and an electromagnetic wave shielding function.

Preferred materials and the like of the second adhesive layer resin and the second adhesive layer conductive particles in the second adhesive layer 133 are the same as the preferred materials and the like of the first adhesive layer resin and the first adhesive layer conductive particles in the first adhesive layer 123.

<First Electromagnetic Wave Shielding Film Placing Step>

In this step, as shown in FIG. 13, the first electromagnetic wave shielding film 120 is placed on the printed wiring board 110 so that the first adhesive layer 123 is in contact with a coverlay 113-side surface of the printed wiring board 110.

The ends of the first adhesive layer 123 protrude from the respective ends of the printed wiring board 110 to form first extending end portions 123a.

<Second Electromagnetic Wave Shielding Film Placing Step>

In this step, as shown in FIG. 14, the second electromagnetic wave shielding film 130 is placed on the printed wiring board 110 so that the second adhesive layer 133 is in contact with a base film 111-side surface of the printed wiring board 110.

The ends of the second adhesive layer 133 protrude from the respective ends of the printed wiring board 110 to form second extending end portions 133a.

<Stacking Step>

In this step, as shown in FIG. 15, the first adhesive layer 123 is stacked on the second adhesive layer 133 so that gaps 140 are created between the first extending end portions 123a of the first adhesive layer 123 at the ends of the first electromagnetic wave shielding film 120 and the second extending end portions 133a of the second adhesive layer 133 at the ends of the second electromagnetic wave shielding film 130, whereby a first intermediate product 151 is prepared.

In the method of producing a shielded printed wiring board of the present invention, as described later, the first adhesive layer 123 and the second adhesive layer 133 are cured in two steps by the initial pressing step and the subsequent pressing step.

Even when the gaps 140 are created between the first extending end portions 123a and the second extending end portions 133a in the stacking step, these steps can remove the air from the gaps 140 and achieve sufficient adhesion between the first adhesive layer 123 and the second adhesive layer 133.

If the first adhesive layer is stacked on the second adhesive layer without creating such gaps in the stacking step, the stacking requires high pressure and takes a long time, resulting in poor productivity.

<Initial Pressing Step>

In this step, as shown in FIG. 16, the first intermediate product 151 is pressurized and heated from a first protective film 121 side and a second protective film 131 side to the extent that the first adhesive layer 123 and the second adhesive layer 133 are not completely cured, whereby a second intermediate product 152 is prepared.

In the initial pressing step, the pressurizing and heating are performed to the extent that the first adhesive layer 123 and the second adhesive layer 133 are not completely cured. In other words, in the initial pressing step, the first adhesive layer 123 and the second adhesive layer 133 are semi-cured.

The semi-curing the first adhesive layer 123 and the second adhesive layer 133 can fix the positions of the first electromagnetic wave shielding film 120 and the second electromagnetic wave shielding film 130.

Thus, in the below-described protective film peeling step, the first protective film 121 and the second protective film 131 are easily peeled off.

In addition, since pressure and heat are applied through the first protective film 121 and the second protective film 131, the pressure can be uniformly applied to the first intermediate product.

In addition, in the below-described subsequent pressing step, the air can be easily removed from the gaps 140 between the first adhesive layer 123 and the second adhesive layer 133.

Preferred conditions of the pressurizing and heating in the initial pressing step are the same as the preferred conditions of the pressurizing and heating in the initial pressing step in the method of producing a shielded printed wiring board according to the first embodiment of the present invention.

<Protective Film Peeling Step>

In this step, as shown in FIG. 17, the first protective film 121 and the second protective film 131 are peeled off from the second intermediate product 152, whereby a third intermediate product 153 is prepared.

<Subsequent Pressing Step>

In this step, as shown in FIG. 18A, the third intermediate product 153 is pressurized and heated from a first insulating layer 122 side and a second insulating layer 132 side to cure the first adhesive layer 123 and the second adhesive layer 133.

Through this step, the air is removed from the gaps 40 between the first adhesive layer 123 and the second adhesive layer 133, the opening 113a is filled with the first adhesive layer 123, and the first adhesive layer 123 is in contact with the ground circuit 112a.

If the first protective film 121 and the second protective film 131 are not peeled off in the protective film peeling step before the subsequent pressing step, the pressure is absorbed and the air is not easily removed from the gaps 140 between the first adhesive layer 123 and the second adhesive layer 133.

In the method of producing a shielded printed wiring board according to the second embodiment of the present invention, the first protective film 121 and the second protective film 131 are peeled off before the subsequent pressing step. Thus, the pressure is less likely to be absorbed in the subsequent pressing step. Accordingly, even when the gaps 140 are present between the first adhesive layer 123 and the second adhesive layer 133, the air can be sufficiently removed from the gaps 140 by the subsequent pressing step.

As a result, the printed wiring board 110, the first adhesive layer 123, and the second adhesive layer 133 can be sufficiently adhered to each other.

Preferred conditions of the pressurizing and heating in the subsequent pressing step are the same as the preferred conditions of the pressurizing and heating in the initial pressing step in the method of producing a shielded printed wiring board according to the first embodiment of the present invention.

In the first electromagnetic wave shielding film preparing step and the second electromagnetic wave shielding film preparing step in the method of producing a shielded printed wiring board according to the second embodiment of the present invention, preferably, the thickness of the first adhesive layer and the thickness of the second adhesive layer are controlled so that the sum of the thickness of the first adhesive layer of the first extending end portion and the thickness of the second adhesive layer of the second extending end portion after the subsequent pressing step is not smaller than one-thirtieth the thickness of the printed wiring board and not larger than the thickness of the printed wiring board. More preferably, the thickness of the first adhesive layer and the thickness of the second adhesive layer are controlled so that the sum is one-twentieth to nine-tenth the thickness of the printed wiring board, and still more preferably, the thickness of the first adhesive layer and the thickness of the second adhesive layer are controlled so that the sum is one-fifteenth to nine-tenth the thickness of the printed wiring board.

Controlling the thickness of the first adhesive layer and/or the thickness of the second adhesive layer to fall within the above ranges achieves easiness of sufficient adhesion between the first adhesive layer and the second adhesive layer.

When the sum of the thickness of the first adhesive layer of the first extending end portion and the thickness of the second adhesive layer of the second extending end portion after the subsequent pressing step is smaller than one-thirtieth the thickness of the printed wiring board, a gap is likely to be created between the first adhesive layer and the second adhesive layer.

When the sum of the thickness of the first adhesive layer of the first extending end portion and the thickness of the second adhesive layer of the second extending end portion after the subsequent pressing step is larger than the thickness of the printed wiring board, the shielded printed wiring board has a large thickness and thus can only be used for limited applications.

Through the above-described steps, a shielded printed wiring board 154 can be produced as shown in FIG. 18B.

The shielded printed wiring board 154 shown in FIG. 18B includes the printed wiring board 110, a first electromagnetic wave shielding portion 120a placed on the upper side of the printed wiring board 110, and a second electromagnetic wave shielding portion 130a placed on the lower side of the printed wiring board 110.

The first electromagnetic wave shielding portion 120a is formed by curing the adhesive layer of the first electromagnetic wave shielding film, and the second electromagnetic wave shielding portion 130a is formed by curing the adhesive layer of the second electromagnetic wave shielding film.

The printed wiring board 110 includes the base film 111, the printed circuit 112 including the ground circuit 112a formed on the base film 111, and the coverlay 113 covering the printed circuit 112, and the coverlay 113 includes the opening 113a where the ground circuit 112a is exposed.

The first electromagnetic wave shielding portion 120a sequentially includes the first insulating layer 122 and the first adhesive layer 123.

The first adhesive layer 123 is in contact with the coverlay 113.

The opening 113a of the coverlay 113 is filled with the first adhesive layer 123, and the first adhesive layer 123 is in contact with the ground circuit 112a.

The second electromagnetic wave shielding portion 130a sequentially includes the second insulating layer 132 and the second adhesive layer 133.

The second adhesive layer 133 is in contact with the base film 111.

In the shielded printed wiring board 154, the first electromagnetic wave shielding portion 120a has a greater width than the printed wiring board 110, and the ends of the first adhesive layer 123 of the first electromagnetic wave shielding portion 120a protrude from the respective ends of the printed wiring board 110 as the first extending end portions 123a.

Also in the shielded printed wiring board 154, the second electromagnetic wave shielding portion 130a has a greater width than the printed wiring board 110, and the ends of the second electromagnetic wave shielding portion 130a protrude from the respective ends of the printed wiring board 110 as the second extending end portions 133a.

The first adhesive layer 123 at the first extending end portions 123a is adhered to the second adhesive layer 133 at the second extending end portions 133a.

In the shielded printed wiring board, the first adhesive layer at the first extending end portion and the second adhesive layer at the second extending end portion are so integrated that the boundary cannot be identified. In FIG. 18B, for convenience, the first adhesive layer 123 at the first extending end portions 123a and the second adhesive layer 133 at the second extending end portions 133a are illustrated as different areas.

Third Embodiment

Next, a method of producing a shielded printed wiring board according to a third embodiment of the present invention, which is an example of the method of producing a shielded printed wiring board of the present invention, is described.

Figure 19:
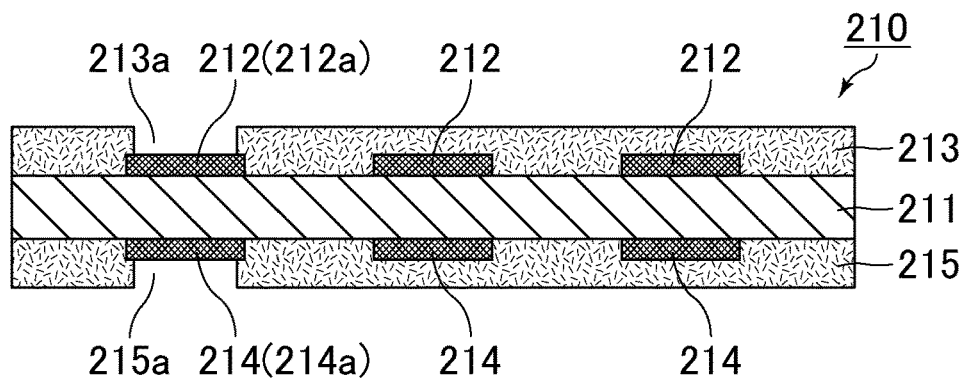
FIG. 19 is a view schematically showing an exemplary printed wiring board preparing step of a method of producing a shielded printed wiring board according to a third embodiment of the present invention.

FIG. 19 is a view schematically showing an exemplary printed wiring board preparing step of the method of producing a shielded printed wiring board according to the third embodiment of the present invention.

Figure 20:
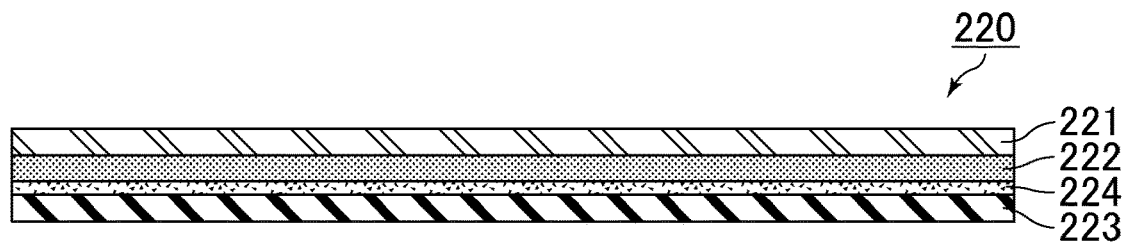
FIG. 20 is a view schematically showing an exemplary first electromagnetic wave shielding film preparing step of the method of producing a shielded printed wiring board according to the third embodiment of the present invention.

FIG. 20 is a view schematically showing an exemplary first electromagnetic wave shielding film preparing step of the method of producing a shielded printed wiring board according to the third embodiment of the present invention.

Figure 21:
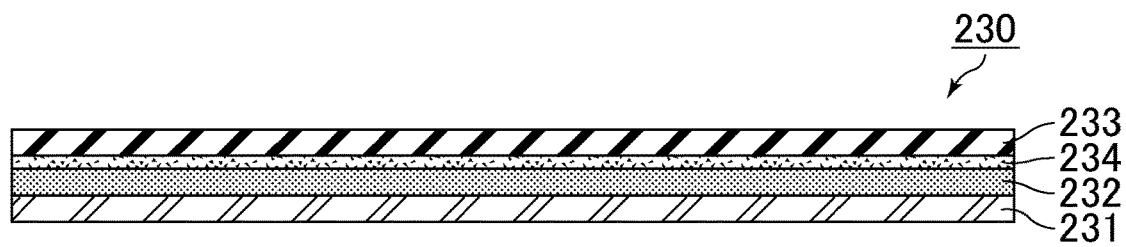
FIG. 21 is a view schematically showing an exemplary second electromagnetic wave shielding film preparing step of the method of producing a shielded printed wiring board according to the third embodiment of the present invention.

FIG. 21 is a view schematically showing an exemplary second electromagnetic wave shielding film preparing step of the method of producing a shielded printed wiring board according to the third embodiment of the present invention.

Figure 22:
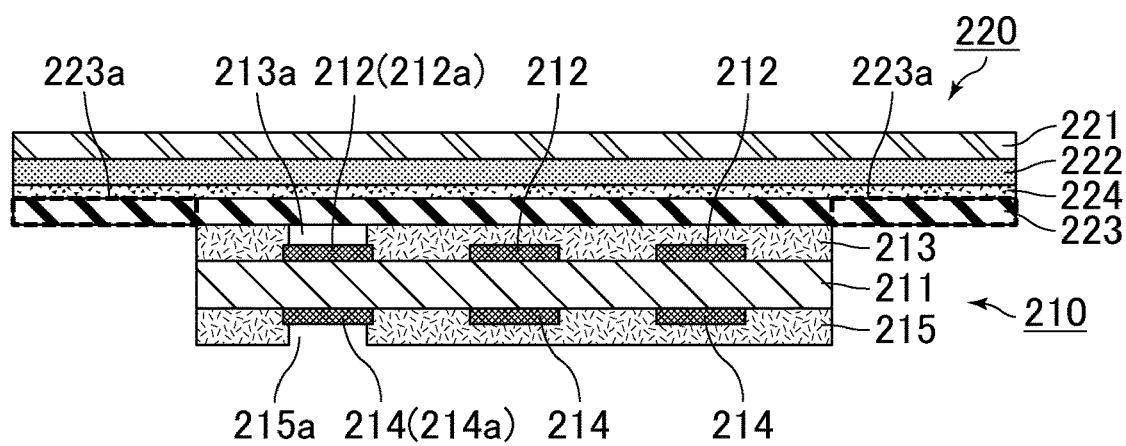
FIG. 22 is a view schematically showing an exemplary first electromagnetic wave shielding film placing step of the method of producing a shielded printed wiring board according to the third embodiment of the present invention.

FIG. 22 is a view schematically showing an exemplary first electromagnetic wave shielding film placing step of the method of producing a shielded printed wiring board according to the third embodiment of the present invention.

Figure 23:
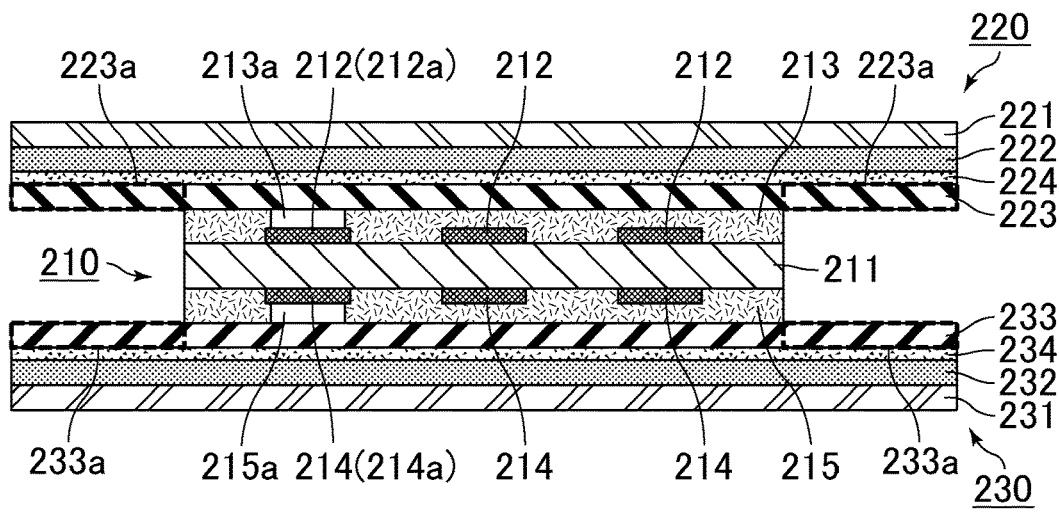
FIG. 23 is a view schematically showing an exemplary second electromagnetic wave shielding film placing step of the method of producing a shielded printed wiring board according to the third embodiment of the present invention.

FIG. 23 is a view schematically showing an exemplary second electromagnetic wave shielding film placing step of the method of producing a shielded printed wiring board according to the third embodiment of the present invention.

Figure 24:
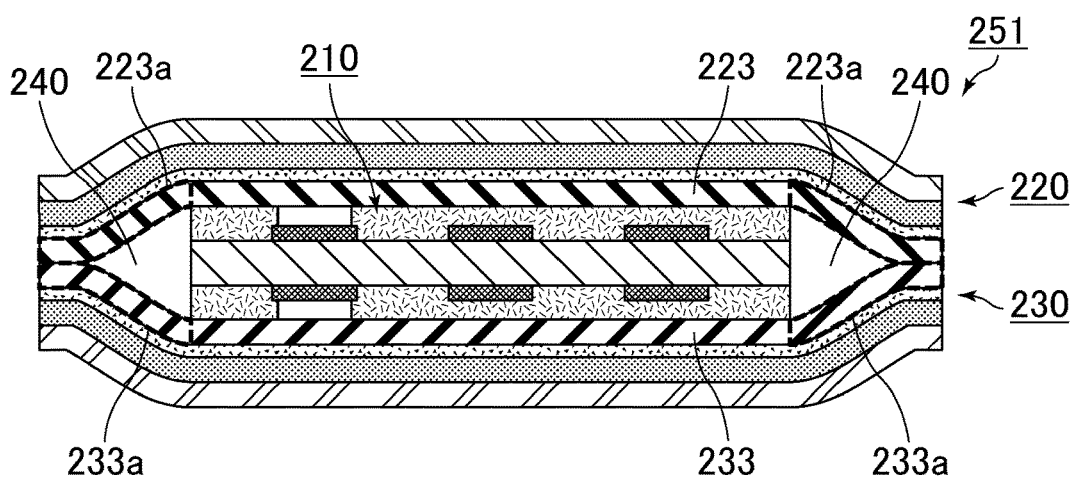
FIG. 24 is a view schematically showing an exemplary stacking step of the method of producing a shielded printed wiring board according to the third embodiment of the present invention.

FIG. 24 is a view schematically showing an exemplary stacking step of the method of producing a shielded printed wiring board according to the third embodiment of the present invention.

Figure 25:
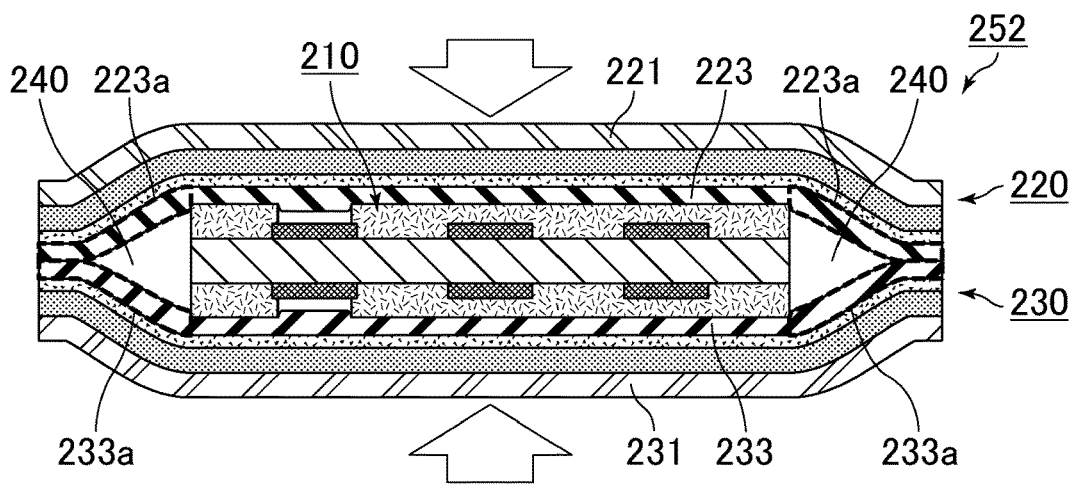
FIG. 25 is a view schematically showing an exemplary initial pressing step of the method of producing a shielded printed wiring board according to the third embodiment of the present invention.

FIG. 25 is a view schematically showing an exemplary initial pressing step of the method of producing a shielded printed wiring board according to the third embodiment of the present invention.

Figure 26:
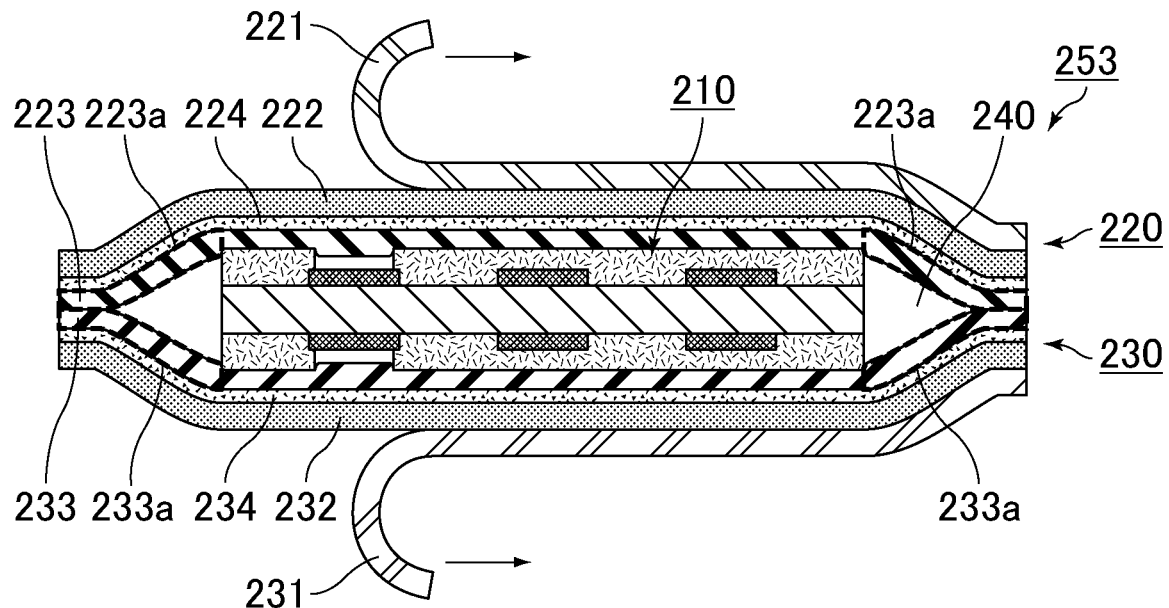
FIG. 26 is a view schematically showing an exemplary protective film peeling step of the method of producing a shielded printed wiring board according to the third embodiment of the present invention.

FIG. 26 is a view schematically showing an exemplary protective film peeling step of the method of producing a shielded printed wiring board according to the third embodiment of the present invention.

Figure 27A:
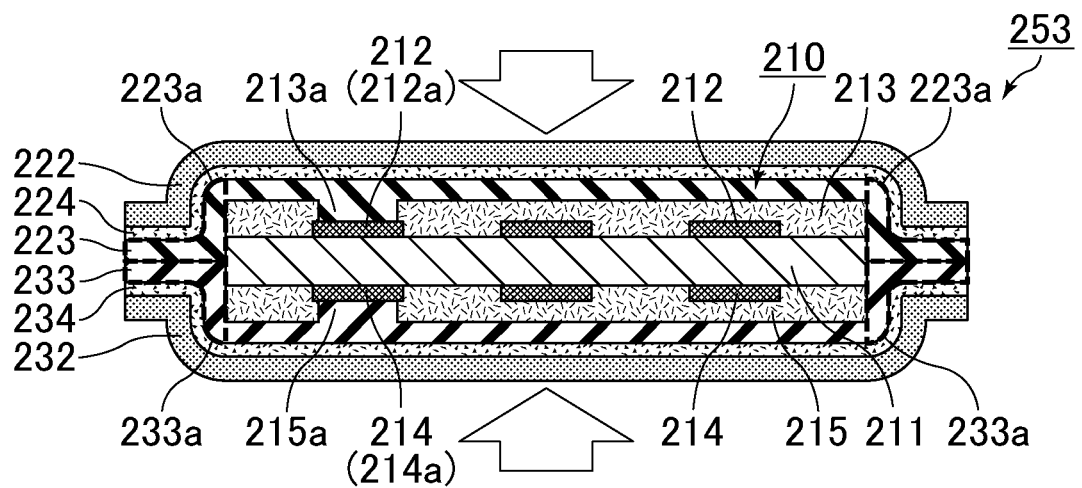
FIG. 27A is a view schematically showing an exemplary subsequent pressing step of the method of producing a shielded printed wiring board according to the third embodiment of the present invention.
Figure 27B:
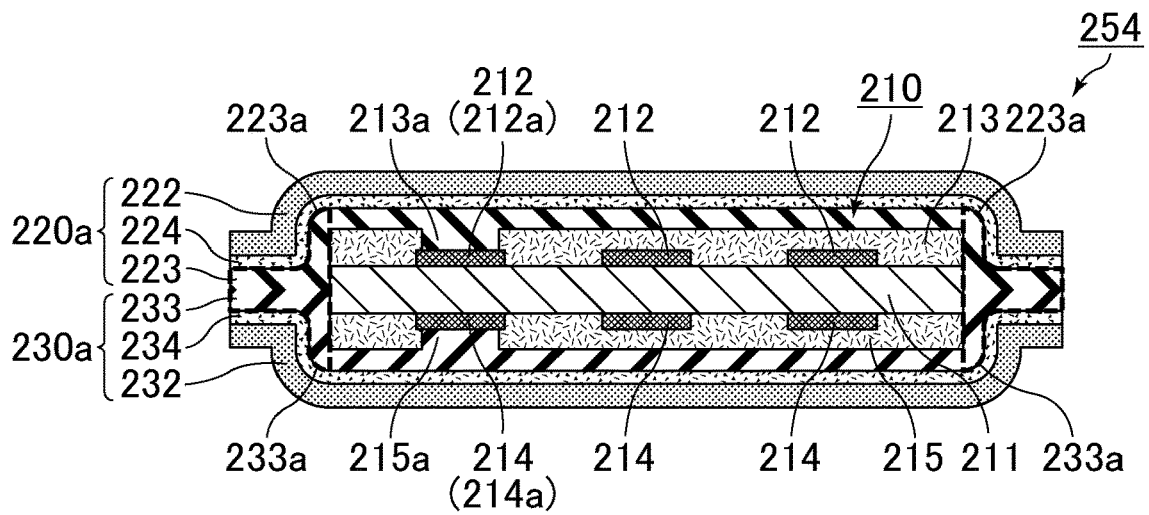
FIG. 27B is a view schematically showing an exemplary subsequent pressing step of the method of producing a shielded printed wiring board according to the third embodiment of the present invention.

FIG. 27A and FIG. 27B are views each schematically showing an exemplary subsequent pressing step of the method of producing a shielded printed wiring board according to the third embodiment of the present invention.

<Printed Wiring Board Preparing Step>

In this step, as shown in FIG. 19, a printed wiring board 210 including a base film 211, a printed circuit 212 formed on one face of the base film 211, a coverlay 213 covering the printed circuit 212, a printed circuit 214 formed on the other face of the base film 211, and a coverlay 215 covering the printed circuit 214 is prepared.

In the printed wiring board 210, the printed circuit 212 includes a ground circuit 212a. The coverlay 213 includes an opening 213a where the ground circuit 212a is exposed.

In the printed wiring board 210, the printed circuit 214 includes a ground circuit 214a. The coverlay 215 includes an opening 215a where the ground circuit 214a is exposed.

Preferred materials and the like of the base film 211, the printed circuit 212, the printed circuit 214, the ground circuit 212a, the ground circuit 214a, the coverlay 213, and the coverlay 215 are the same as the preferred materials and the like of the base film 11, the printed circuit 12, the ground circuit 12a, and the coverlay 13 in the method of producing a shielded printed wiring board according to the first embodiment of the present invention.

<First Electromagnetic Wave Shielding Film Preparing Step>

In this step, as shown in FIG. 20, a first electromagnetic wave shielding film 220 sequentially including a first protective film 221, a first insulating layer 222, a first shielding layer 224, and a first adhesive layer 223 is prepared.

The first electromagnetic wave shielding film 220 has a greater width than the printed wiring board 210, and the first adhesive layer 223 has conductivity.

Preferred materials and the like of the first protective film 221, the first insulating layer 222, the first shielding layer 224, and the first adhesive layer 223 are the same as the preferred materials and the like of the first protective film 21, the first insulating layer 22, the first shielding layer 24, and the first adhesive layer 23 in the method of producing a shielded printed wiring board according to the first embodiment of the present invention.

<Second Electromagnetic Wave Shielding Film Preparing Step>

In this step, as shown in FIG. 21, a second electromagnetic wave shielding film 230 sequentially including a second protective film 231, a second insulating layer 232, a second shielding layer 234, and a second adhesive layer 233 is prepared.

The second electromagnetic wave shielding film 230 has a greater width than the printed wiring board 210, and the second adhesive layer 233 has conductivity.

Preferred materials and the like of the second protective film 231, the second insulating layer 232, the second shielding layer 234, and the second adhesive layer 233 are the same as the preferred materials and the like of the second protective film 31, the second insulating layer 32, the second shielding layer 34, and the second adhesive layer 33 in the method of producing a shielded printed wiring board according to the first embodiment of the present invention.

<First Electromagnetic Wave Shielding Film Placing Step>

In this step, as shown in FIG. 22, the first electromagnetic wave shielding film 220 is placed on the printed wiring board 210 so that the first adhesive layer 223 is in contact with a coverlay 213-side surface of the printed wiring board 210.

The ends of the first adhesive layer 223 protrude from the respective ends of the printed wiring board 210 to form first extending end portions 223a.

<Second Electromagnetic Wave Shielding Film Placing Step>

In this step, as shown in FIG. 23, the second electromagnetic wave shielding film 230 is placed on the printed wiring board 210 so that the second adhesive layer 233 is in contact with a coverlay 215-side surface of the printed wiring board 210.

The ends of the second adhesive layer 233 protrude from the respective ends of the printed wiring board 210 to form second extending end portions 233a.

<Stacking Step>

In this step, as shown in FIG. 24, the first adhesive layer 223 is stacked on the second adhesive layer 233 so that gaps 240 are created between the first extending end portions 223a of the first adhesive layer 223 at the ends of the first electromagnetic wave shielding film 220 and the second extending end portions 33a of the second adhesive layer 233 at the ends of the second electromagnetic wave shielding film 230, whereby a first intermediate product 251 is prepared.

In the method of producing a shielded printed wiring board of the present invention, as described later, the first adhesive layer 223 and the second adhesive layer 233 are cured in two steps by the initial pressing step and the subsequent pressing step.

Even when the gaps 240 are created between the first extending end portions 223a and the second extending end portions 233a in the stacking step, these steps can remove the air from the gaps 240 and achieve sufficient adhesion between the first adhesive layer 223 and the second adhesive layer 233.

If the first adhesive layer is stacked on the second adhesive layer without creating such gaps in the stacking step, the stacking requires high pressure and takes a long time, resulting in poor productivity.

<Initial Pressing Step>

In this step, as shown in FIG. 25, the first intermediate product 251 is pressurized and heated from a first protective film 221 side and a second protective film 231 side to the extent that the first adhesive layer 223 and the second adhesive layer 233 are not completely cured, whereby a second intermediate product 252 is prepared.

In the initial pressing step, the pressurizing and heating are performed to the extent that the first adhesive layer 223 and the second adhesive layer 233 are not completely cured. In other words, in the initial pressing step, the first adhesive layer 223 and the second adhesive layer 233 are semi-cured.

The semi-curing the first adhesive layer 223 and the second adhesive layer 233 can fix the positions of the first electromagnetic wave shielding film 220 and the second electromagnetic wave shielding film 230.

Thus, in the below-described protective film peeling step, the first protective film 221 and the second protective film 231 are easily peeled off.

In addition, since pressure and heat are applied through the first protective film 221 and the second protective film 231, the pressure can be uniformly applied to the first intermediate product.

In addition, in the below-described subsequent pressing step, the air can be easily removed from the gaps 240 between the first adhesive layer 223 and the second adhesive layer 233.

Preferred conditions of the pressurizing and heating in the initial pressing step are the same as the preferred conditions of the pressurizing and heating in the initial pressing step in the method of producing a shielded printed wiring board according to the first embodiment of the present invention.

<Protective Film Peeling Step>

In this step, as shown in FIG. 26, the first protective film 221 and the second protective film 231 are peeled off from the second intermediate product 252, whereby a third intermediate product 253 is prepared.

<Subsequent Pressing Step>

In this step, as shown in FIG. 27A, the third intermediate product 253 is pressurized and heated from a first insulating layer 222 side and a second insulating layer 232 side to cure the first adhesive layer 223 and the second adhesive layer 233.

Through this step, the air is removed from the gaps 240 between the first adhesive layer 223 and the second adhesive layer 233, the opening 213a is filled with the first adhesive layer 223, and the first adhesive layer 223 is in contact with the ground circuit 212a. Also, the opening 215a is filled with the second adhesive layer 233, and the second adhesive layer 233 is in contact with the ground circuit 214a.

If the first protective film 221 and the second protective film 231 are not peeled off in the protective film peeling step before the subsequent pressing step, the pressure is absorbed and the air is not easily removed from the gaps 240 between the first adhesive layer 223 and the second adhesive layer 233.

In the method of producing a shielded printed wiring board according to the second embodiment of the present invention, the first protective film 221 and the second protective film 231 are peeled off before the subsequent pressing step. Thus, the pressure is less likely to be absorbed in the subsequent pressing step. Accordingly, even when the gaps 240 are present between the first adhesive layer 223 and the second adhesive layer 233, the air can be easily removed from the gaps 40 by the subsequent pressing step.

As a result, the printed wiring board 210, the first adhesive layer 223, and the second adhesive layer 233 can be sufficiently adhered to each other.

Preferred conditions of the pressurizing and heating in the subsequent pressing step are the same as the preferred conditions of the pressurizing and heating in the initial pressing step in the method of producing a shielded printed wiring board according to the first embodiment of the present invention.

In the first electromagnetic wave shielding film preparing step and the second electromagnetic wave shielding film preparing step in the method of producing a shielded printed wiring board according to the third embodiment of the present invention, preferably, the thickness of the first adhesive layer and the thickness of the second adhesive layer are controlled so that the sum of the thickness of the first adhesive layer of the first extending end portion and the thickness of the second adhesive layer of the second extending end portion after the subsequent pressing step is not smaller than one-thirtieth the thickness of the printed wiring board and not larger than the thickness of the printed wiring board. More preferably, the thickness of the first adhesive layer and the thickness of the second adhesive layer are controlled so that the sum is one-twentieth to nine-tenth the thickness of the printed wiring board, and still more preferably, the thickness of the first adhesive layer and the thickness of the second adhesive layer are controlled so that the sum is one-fifteenth to nine-tenth the thickness of the printed wiring board.

Controlling the thickness of the first adhesive layer and/or the thickness of the second adhesive layer to fall within the above ranges achieves easiness of sufficient adhesion between the first adhesive layer and the second adhesive layer.

When the sum of the thickness of the first adhesive layer of the first extending end portion and the thickness of the second adhesive layer of the second extending end portion after the subsequent pressing step is smaller than one-thirtieth the thickness of the printed wiring board, a gap is likely to be created between the first adhesive layer and the second adhesive layer.

When the sum of the thickness of the first adhesive layer of the first extending end portion and the thickness of the second adhesive layer of the second extending end portion after the subsequent pressing step is larger than the thickness of the printed wiring board, the shielded printed wiring board has a large thickness and thus can only be used for limited applications.

Through the above-described steps, a shielded printed wiring board 254 can be produced as shown in FIG. 27B.

The shielded printed wiring board 254 shown in FIG. 27B includes the printed wiring board 210, a first electromagnetic wave shielding portion 220a placed on the upper side of the printed wiring board 210, and a second electromagnetic wave shielding portion 230a placed on the lower side of the printed wiring board 210.

The first electromagnetic wave shielding portion 220a is formed by curing the adhesive layer of the first electromagnetic wave shielding film, and the second electromagnetic wave shielding portion 230a is formed by curing the adhesive layer of the second electromagnetic wave shielding film.

The printed wiring board 210 includes the base film 211, the printed circuit 212 formed on one face of the base film 211, the coverlay 213 covering the printed circuit 212, the printed circuit 214 formed on the other face of the base film, and the coverlay 215 covering the printed circuit 214.

The printed circuit 212 includes the ground circuit 212a, and the printed circuit 214 includes the ground circuit 214a.

The coverlay 213 includes the opening 213a where the ground circuit 212a is exposed, and the coverlay 215 includes the opening 215a where the ground member 214a is exposed.

The first electromagnetic wave shielding portion 220a sequentially includes the first insulating layer 222, the first shielding layer 224, and the first adhesive layer 223.

The first adhesive layer 223 is in contact with the coverlay 213.

The opening 213a of the coverlay 213 is filled with the first adhesive layer 223, and the first adhesive layer 223 is in contact with the ground circuit 212a.

The second electromagnetic wave shielding portion 230a sequentially includes the second insulating layer 232, the second shielding layer 234, and the second adhesive layer 233.

The second adhesive layer 233 is in contact with the coverlay 215.

The opening 215a of the coverlay 215 is filled with the second adhesive layer 233, and the second adhesive layer 233 is in contact with the ground circuit 214a.

In the shielded printed wiring board 254, the first electromagnetic wave shielding portion 220a has a greater width than the printed wiring board 210, and the ends of the first adhesive layer 223 of the first electromagnetic wave shielding portion 220a protrude from the respective ends of the printed wiring board 210 as the first extending end portions 223a.

Also in the shielded printed wiring board 254, the second electromagnetic wave shielding portion 230a has a greater width than the printed wiring board 210, and the ends of the second electromagnetic wave shielding portion 230a protrude from the respective ends of the printed wiring board 210 as the second extending end portions 233a.

The first adhesive layer 223 at the first extending end portions 223a is adhered to the second adhesive layer 233 at the second extending end portions 233a.

In the shielded printed wiring board, the first adhesive layer at the first extending end portion and the second adhesive layer at the second extending end portion are so integrated that the boundary cannot be identified. In FIG. 27B, for convenience, the first adhesive layer 223 at the first extending end portions 223a and the second adhesive layer 233 at the second extending end portions 233a are illustrated as different areas.

Fourth Embodiment

Next, a method of producing a shielded printed wiring board according to a fourth embodiment of the present invention, which is an example of the method of producing a shielded printed wiring board of the present invention, is described.

Figure 28:
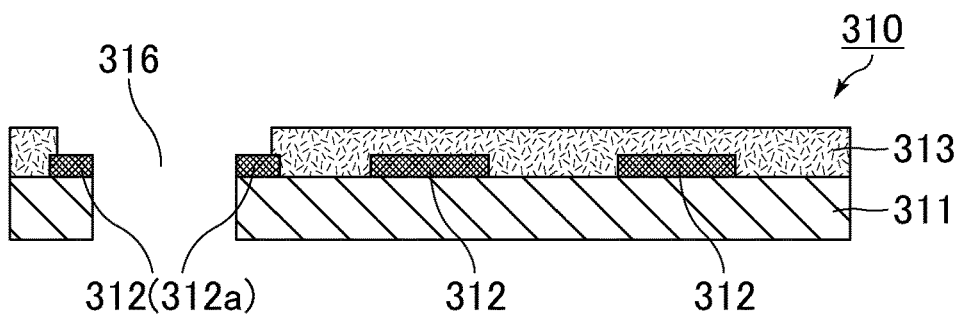
FIG. 28 is a view schematically showing an exemplary printed wiring board preparing step of a method of producing a shielded printed wiring board according to a fourth embodiment of the present invention.

FIG. 28 is a view schematically showing an exemplary printed wiring board preparing step of the method of producing a shielded printed wiring board according to the fourth embodiment of the present invention.

Figure 29:
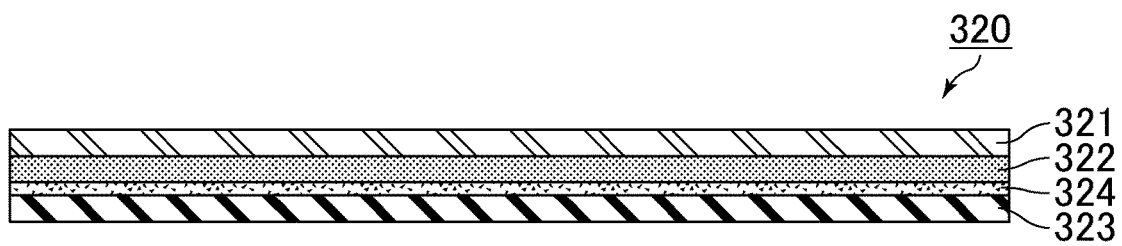
FIG. 29 is a view schematically showing an exemplary first electromagnetic wave shielding film preparing step of the method of producing a shielded printed wiring board according to the fourth embodiment of the present invention.

FIG. 29 is a view schematically showing an exemplary first electromagnetic wave shielding film preparing step of the method of producing a shielded printed wiring board according to the fourth embodiment of the present invention.

Figure 30:
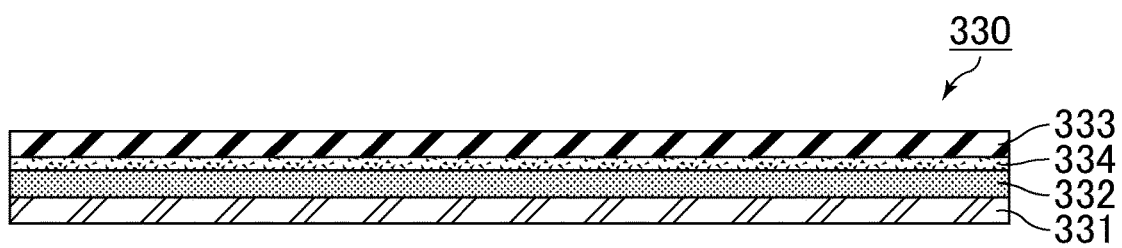
FIG. 30 is a view schematically showing an exemplary second electromagnetic wave shielding film preparing step of the method of producing a shielded printed wiring board according to the fourth embodiment of the present invention.

FIG. 30 is a view schematically showing an exemplary second electromagnetic wave shielding film preparing step of the method of producing a shielded printed wiring board according to the fourth embodiment of the present invention.

Figure 31:
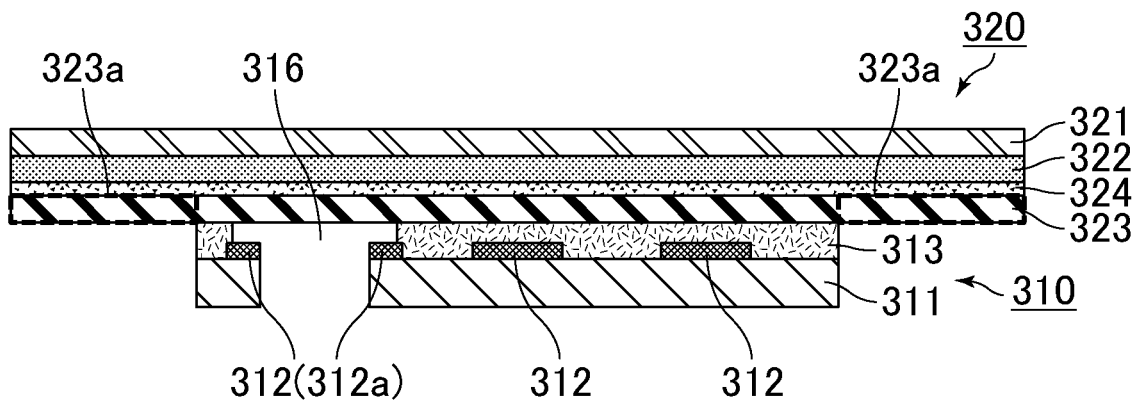
FIG. 31 is a view schematically showing an exemplary first electromagnetic wave shielding film placing step of the method of producing a shielded printed wiring board according to the fourth embodiment of the present invention.

FIG. 31 is a view schematically showing an exemplary first electromagnetic wave shielding film placing step of the method of producing a shielded printed wiring board according to the fourth embodiment of the present invention.

Figure 32:
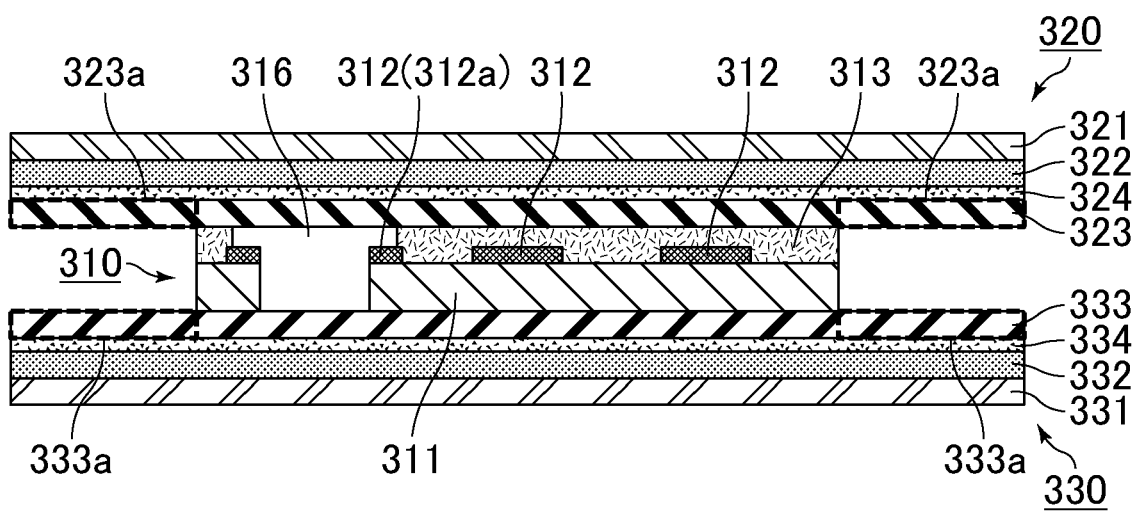
FIG. 32 is a view schematically showing an exemplary second electromagnetic wave shielding film placing step of the method of producing a shielded printed wiring board according to the fourth embodiment of the present invention.

FIG. 32 is a view schematically showing an exemplary second electromagnetic wave shielding film placing step of the method of producing a shielded printed wiring board according to the fourth embodiment of the present invention.

Figure 33:
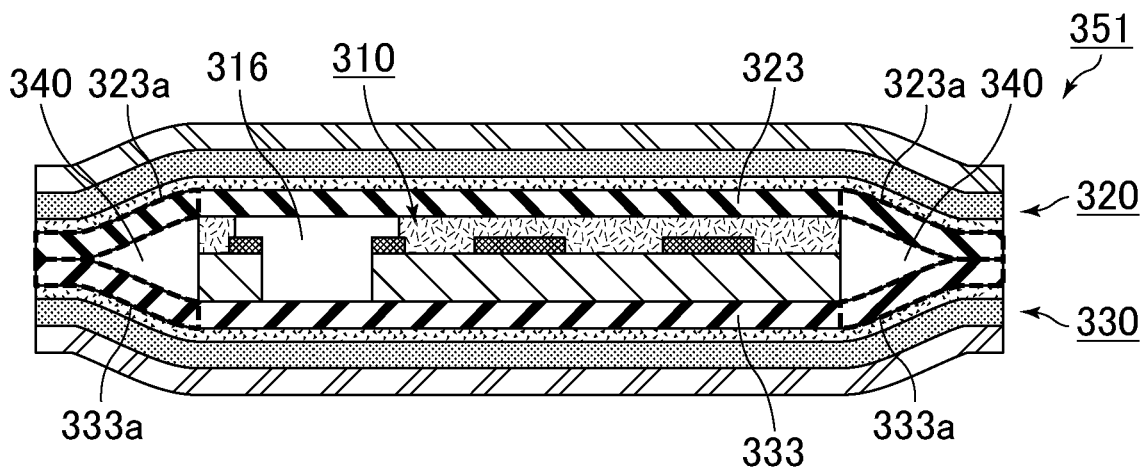
FIG. 33 is a view schematically showing an exemplary stacking step of the method of producing a shielded printed wiring board according to the fourth embodiment of the present invention.

FIG. 33 is a view schematically showing an exemplary stacking step of the method of producing a shielded printed wiring board according to the fourth embodiment of the present invention.

Figure 34:
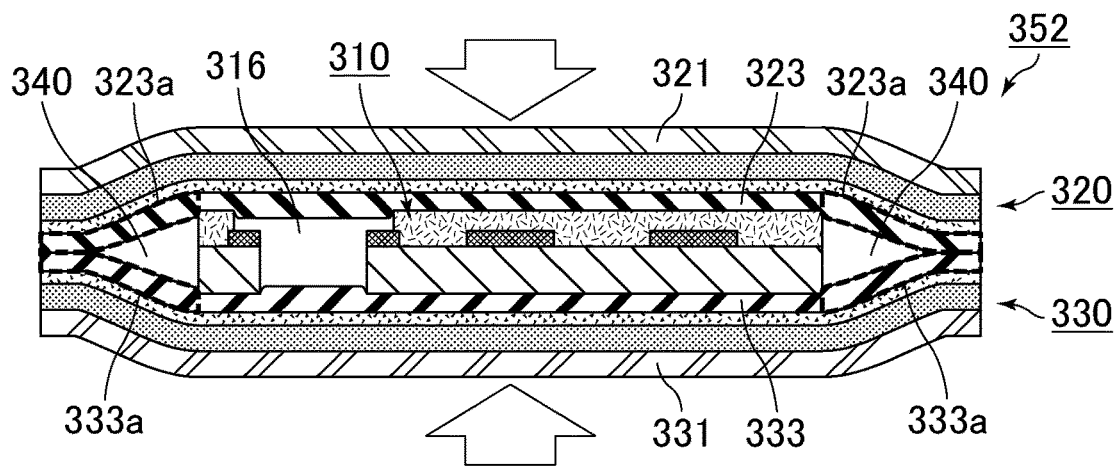
FIG. 34 is a view schematically showing an exemplary initial pressing step of the method of producing a shielded printed wiring board according to the fourth embodiment of the present invention.

FIG. 34 is a view schematically showing an exemplary initial pressing step of the method of producing a shielded printed wiring board according to the fourth embodiment of the present invention.

Figure 35:
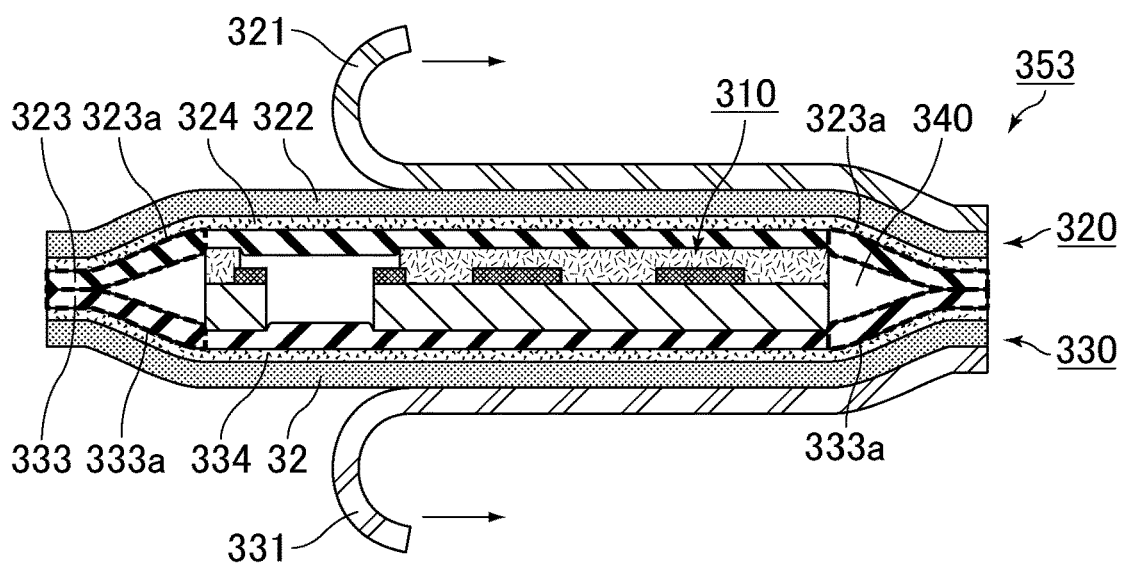
FIG. 35 is a view schematically showing an exemplary protective film peeling step of the method of producing a shielded printed wiring board according to the fourth embodiment of the present invention.

FIG. 35 is a view schematically showing an exemplary protective film peeling step of the method of producing a shielded printed wiring board according to the fourth embodiment of the present invention.

Figure 36A:
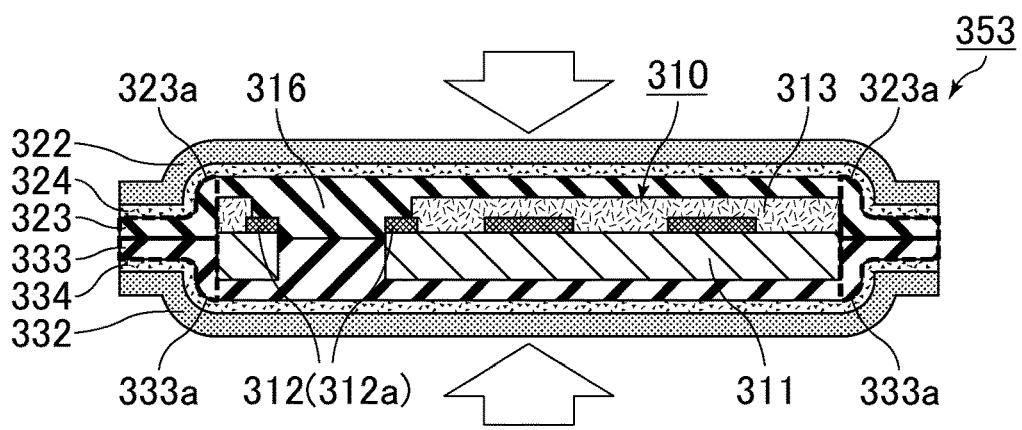
FIG. 36A is a view schematically showing an exemplary subsequent pressing step of the method of producing a shielded printed wiring board according to the fourth embodiment of the present invention.
Figure 36B:
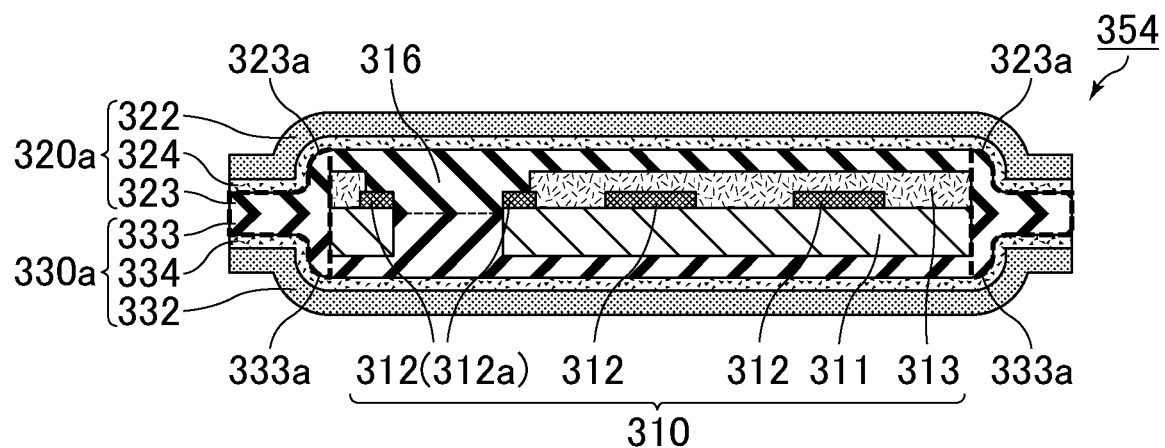
FIG. 36B is a view schematically showing an exemplary subsequent pressing step of the method of producing a shielded printed wiring board according to the fourth embodiment of the present invention.

FIG. 36A and FIG. 36B are views each schematically showing an exemplary subsequent pressing step of the method of producing a shielded printed wiring board according to the fourth embodiment of the present invention.

<Printed Wiring Board Preparing Step>

In this step, as shown in FIG. 28, a printed wiring board 310 including a base film 311, a printed circuit 312 formed on the base film 311, and a coverlay 313 covering the printed circuit 312 is prepared.

In the printed wiring board 310, the printed circuit 312 includes a ground circuit 312a.

The printed wiring board 310 includes a through hole 316 penetrating the base film 311 and the coverlay 313, and the ground circuit 312a is exposed at the through hole 316.

<First Electromagnetic Wave Shielding Film Preparing Step>

In this step, as shown in FIG. 29, a first electromagnetic wave shielding film 320 sequentially including a first protective film 321, a first insulating layer 322, a first shielding layer 324, and a first adhesive layer 323 is prepared.

The first electromagnetic wave shielding film 320 has a greater width than the printed wiring board 310, and the first adhesive layer 323 has conductivity.

Preferred materials and the like of the first protective film 321, the first insulating layer 322, the first shielding layer 324, and the first adhesive layer 323 are the same as the preferred materials and the like of the first protective film 21, the first insulating layer 22, the first shielding layer 24, and the first adhesive layer 23 in the method of producing a shielded printed wiring board according to the first embodiment of the present invention.

<Second Electromagnetic Wave Shielding Film Preparing Step>

In this step, as shown in FIG. 30, a second electromagnetic wave shielding film 330 sequentially including a second protective film 331, a second insulating layer 332, a second shielding layer 334, and a second adhesive layer 333 is prepared.

The second electromagnetic wave shielding film 330 has a greater width than the printed wiring board 310, and the second adhesive layer 333 has conductivity.

Preferred materials and the like of the second protective film 331, the second insulating layer 332, the second shielding layer 334, and the second adhesive layer 333 are the same as the preferred materials and the like of the second protective film 31, the second insulating layer 32, the second shielding layer 34, and the second adhesive layer 33 in the method of producing a shielded printed wiring board according to the first embodiment of the present invention.

<First Electromagnetic Wave Shielding Film Placing Step>

In this step, as shown in FIG. 31, the first electromagnetic wave shielding film 320 is placed on the printed wiring board 310 so that the first adhesive layer 323 is in contact with a coverlay 313-side surface of the printed wiring board 310.

The ends of the first adhesive layer 323 protrude from the respective ends of the printed wiring board 310 to form first extending end portions 323a.

<Second Electromagnetic Wave Shielding Film Placing Step>

In this step, as shown in FIG. 32, the second electromagnetic wave shielding film 330 is placed on the printed wiring board 310 so that the second adhesive layer 333 is in contact with a base film 311-side surface of the printed wiring board 310.

The ends of the second adhesive layer 333 protrude from the respective ends of the printed wiring board 310 to form second extending end portions 333a.

<Stacking Step>

In this step, as shown in FIG. 33, the first adhesive layer 323 is stacked on the second adhesive layer 333 so that gaps 340 are created between the first extending end portions 323a of the first adhesive layer 323 at the ends of the first electromagnetic wave shielding film 320 and the second extending end portions 333a of the second adhesive layer 333 at the ends of the second electromagnetic wave shielding film 330.

The first adhesive layer 323 is stacked on the second adhesive layer 333 so that the gaps 340 are created in the through hole 316 present between the first adhesive layer 323 of the first electromagnetic wave shielding film 320 placed over the through hole 316 and the second adhesive layer 333 of the second electromagnetic wave shielding film 330.

Thus, a first intermediate product 351 is prepared.

In the method of producing a shielded printed wiring board of the present invention, as described later, the first adhesive layer 323 and the second adhesive layer 333 are cured in two steps by the initial pressing step and the subsequent pressing step.

Even when the gaps 340 are created between the first extending end portions 323a and the second extending end portions 333a or in the through hole 316 in the stacking step, these steps can remove the air from the gaps 340 and achieve sufficient adhesion between the first adhesive layer 323 and the second adhesive layer 333.

If the first adhesive layer is stacked on the second adhesive layer without creating such gaps in the stacking step, the stacking requires high pressure and takes a long time, resulting in poor productivity.

<Initial Pressing Step>

In this step, as shown in FIG. 34, the first intermediate product 351 is pressurized and heated from a first protective film 321 side and a second protective film 331 side to the extent that the first adhesive layer 323 and the second adhesive layer 333 are not completely cured, whereby a second intermediate product 352 is prepared.

In the initial pressing step, the pressurizing and heating are performed to the extent that the first adhesive layer 323 and the second adhesive layer 333 are not completely cured. In other words, in the initial pressing step, the first adhesive layer 323 and the second adhesive layer 333 are semi-cured.

The semi-curing the first adhesive layer 323 and the second adhesive layer 333 can fix the positions of the first electromagnetic wave shielding film 320 and the second electromagnetic wave shielding film 330.

Thus, in the below-described protective film peeling step, the first protective film 321 and the second protective film 331 are easily peeled off.

In addition, since pressure and heat are applied through the first protective film 321 and the second protective film 331, the pressure can be uniformly applied to the first intermediate product.

In addition, in the below-described subsequent pressing step, the air can be easily removed from the gaps 340 between the first adhesive layer 323 and the second adhesive layer 333.

<Protective Film Peeling Step>

In this step, as shown in FIG. 35, the first protective film 321 and the second protective film 331 are peeled off from the second intermediate product 352, whereby a third intermediate product 353 is prepared.

<Subsequent Pressing Step>

In this step, as shown in FIG. 36A, the third intermediate product 353 is pressurized and heated from a first insulating layer 322 side and a second insulating layer 332 side to cure the first adhesive layer 323 and the second adhesive layer 333.

Through this step, the air is removed from the gaps 340 between the first adhesive layer 323 and the second adhesive layer 333, and the though hole 316 is filled with the first adhesive layer 323 and the second adhesive layer 333.

Also, the first adhesive layer 323 is in contact with the ground circuit 312a.

Also, the first adhesive layer 323 is in contact with the second adhesive layer 333 via the through hole 316.

If the first protective film 321 and the second protective film 331 are not peeled off in the protective film peeling step before the subsequent pressing step, the pressure is absorbed and the air is not easily removed from the gaps 340 between the first adhesive layer 323 and the second adhesive layer 333.

In the method of producing a shielded printed wiring board according to the second embodiment of the present invention, the first protective film 321 and the second protective film 331 are peeled off before the subsequent pressing step. Thus, the pressure is less likely to be absorbed in the subsequent pressing step. Accordingly, even when the gaps 340 are present between the first adhesive layer 323 and the second adhesive layer 333, the air can be sufficiently removed from the gaps 40 by the subsequent pressing step.

As a result, the printed wiring board 310, the first adhesive layer 323, and the second adhesive layer 333 can be sufficiently adhered to each other.

Preferred conditions of the pressurizing and heating in the subsequent pressing step are the same as the preferred conditions of the pressurizing and heating in the initial pressing step in the method of producing a shielded printed wiring board according to the first embodiment of the present invention.

In the first electromagnetic wave shielding film preparing step and the second electromagnetic wave shielding film preparing step in the method of producing a shielded printed wiring board according to the fourth embodiment of the present invention, preferably, the thickness of the first adhesive layer and the thickness of the second adhesive layer are controlled so that the sum of the thickness of the first adhesive layer of the first extending end portion and the thickness of the second adhesive layer of the second extending end portion after the subsequent pressing step is not smaller than one-thirtieth the thickness of the printed wiring board and not larger than the thickness of the printed wiring board. More preferably, the thickness of the first adhesive layer and the thickness of the second adhesive layer are controlled so that the sum is one-twentieth to nine-tenth the thickness of the printed wiring board, and still more preferably, the thickness of the first adhesive layer and the thickness of the second adhesive layer are controlled so that the sum is one-fifteenth to nine-tenth the thickness of the printed wiring board.

Controlling the thickness of the first adhesive layer and/or the thickness of the second adhesive layer to fall within the above ranges achieves easiness of sufficient adhesion between the first adhesive layer and the second adhesive layer.

When the sum of the thickness of the first adhesive layer of the first extending end portion and the thickness of the second adhesive layer of the second extending end portion after the subsequent pressing step is smaller than one-thirtieth the thickness of the printed wiring board, a gap is likely to be created between the first adhesive layer and the second adhesive layer.

When the sum of the thickness of the first adhesive layer of the first extending end portion and the thickness of the second adhesive layer of the second extending end portion after the subsequent pressing step is larger than the thickness of the printed wiring board, the shielded printed wiring board has a large thickness and thus can only be used for limited applications.

Through the above-described steps, a shielded printed wiring board 354 can be produced as shown in FIG. 36B.

The shielded printed wiring board 354 shown in FIG. 36B includes the printed wiring board 310, a first electromagnetic wave shielding portion 320a placed on the upper side of the printed wiring board 310, and a second electromagnetic wave shielding portion 330a placed on the lower side of the printed wiring board 310.

The first electromagnetic wave shielding portion 320a is formed by curing the adhesive layer of the first electromagnetic wave shielding film, and the second electromagnetic wave shielding portion 330a is formed by curing the adhesive layer of the second electromagnetic wave shielding film.

The printed wiring board 310 includes the base film 311, the printed circuit 312 including the ground circuit 312a formed on the base film 311, and the coverlay 313 covering the printed circuit 312.

The printed wiring board 310 also includes the through hole 316 penetrating the base film 311 and the coverlay 313, and the ground circuit 312a is exposed at the through hole 316.

The first electromagnetic wave shielding portion 320a sequentially includes the first insulating layer 322 and the first adhesive layer 323.

The first adhesive layer 323 is in contact with the coverlay 313.

The through hole 316 is filled with the first adhesive layer 323, and the first adhesive layer 323 is in contact with the ground circuit 312a.

The second electromagnetic wave shielding portion 330a sequentially includes the second insulating layer 332 and the second adhesive layer 333.

The second adhesive layer 333 is in contact with the base film 311.

The through hole 316 is filled with the second adhesive layer 333, and the first adhesive layer 323 is in contact with the second adhesive layer 333.

In the shielded printed wiring board 354, the first electromagnetic wave shielding portion 320a has a greater width than the printed wiring board 310, and the ends of the first adhesive layer 323 of the first electromagnetic wave shielding portion 320a protrude from the respective ends of the printed wiring board 310 as the first extending end portions 323a.

Also in the shielded printed wiring board 354, the second electromagnetic wave shielding portion 330a has a greater width than the printed wiring board 310, and the ends of the second electromagnetic wave shielding portion 330a protrude from the respective ends of the printed wiring board 310 as the second extending end portions 333a.

The first adhesive layer 323 at the first extending end portions 323a is adhered to the second adhesive layer 333 at the second extending end portions 333a.

In the shielded printed wiring board, the first adhesive layer at the first extending end portion and the second adhesive layer at the second extending end portion are so integrated that the boundary cannot be identified. In FIG. 36B, for convenience, the first adhesive layer 323 at the first extending end portions 323a and the second adhesive layer 333 at the second extending end portions 333a are illustrated as different areas.

Fifth Embodiment

Next, a shielded printed wiring board according to a fifth embodiment, which is an example of the shielded printed wiring board of the present invention, is described.

Figure 37:
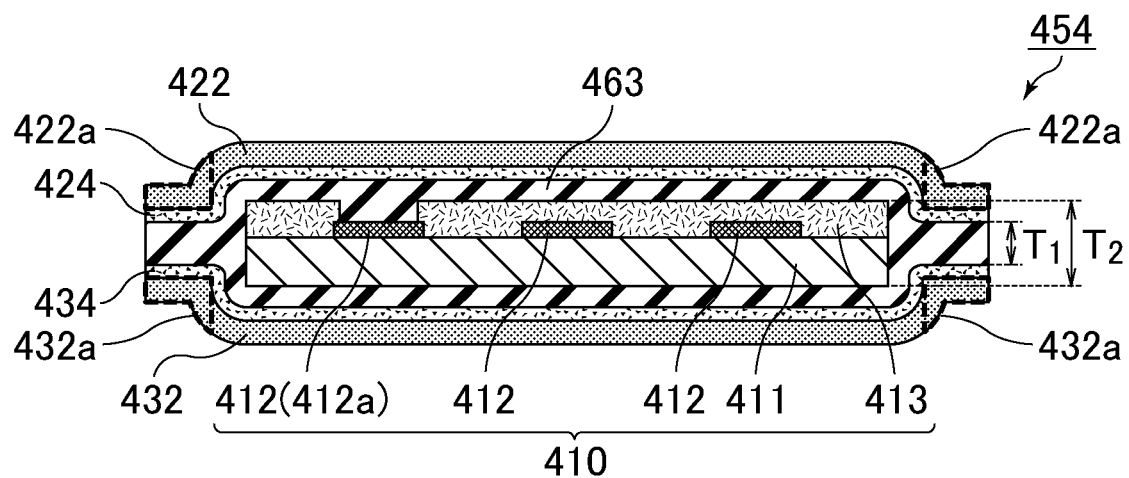
FIG. 37 is a cross-section schematically showing an exemplary shielded printed wiring board according to a fifth embodiment of the present invention.

FIG. 37 is a cross-section schematically showing an exemplary shielded printed wiring board according to the fifth embodiment of the present invention.

A shielded printed wiring board 454 shown in FIG. 37 includes: a printed wiring board 410 including a base film 411, a printed circuit 412 formed on the base film 411, and a coverlay 413 covering the printed circuit 412; a first insulating layer 422 covering one face of the printed wiring board 410; and a second insulating layer 432 covering the other face of the printed wiring board 410.

Part of the first insulating layer 422 protrudes from the ends of the printed wiring board 410 as first insulating layer extending end portions 422a, and part of the second insulating layer 432 protrudes from the ends of the printed wiring board 410 as second insulating layer extending end portions 432a.

The first insulating layer extending end portions 422a face the second insulating layer extending end portions 432a.

The space between the first insulating layer 422 and the one face of the printed wiring board 410, the space between the second insulating layer 432 and the other face of the printed wiring board 410, and the regions where the first insulating layer extending end portions 422a face the second insulating layer extending end portions 432a are filled with a conductive resin composition 463.

The thickness T1 of the conductive resin composition 463 between the first insulating layer 422 and the second insulating layer 432 in each of the regions where the first insulating layer extending end portions 422a face the second insulating layer extending end portions 432a is not smaller than one-thirtieth the thickness T2 of the printed wiring board 410 and not larger than the thickness T2.

Preferably, the thickness T1 of the conductive resin composition 463 is one-twentieth to nine-tenth the thickness T2 of the printed wiring board 410, and more preferably, the thickness T1 is one-fifteenth to nine-tenth the thickness T2.

In the production of the shielded printed wiring board 454, the amount of the conductive resin composition 463 is controlled so that the thickness of the conductive resin composition 463 between the first insulating layer 422 and the second insulating layer 432 in each of the regions where the first insulating layer extending end portions 422a face the second insulating layer extending end portions 432a falls within such ranges of the thickness. Thereby, the spaces between the first insulating layer 422 and the second insulating layer 432 in the regions where the first insulating layer extending end portions 432a face the second insulating layer extending end portions 422a can be filled with the conductive resin composition 463 without gaps.

In the shielded printed wiring board 454, the printed circuit 412 of the printed wiring board 410 includes a ground circuit 412a, part of the ground circuit 412a is exposed at an opening in the coverlay 413, and the ground circuit 412a is electrically connected to the conductive resin composition 463.

The printed wiring board 454 having such a structure enables electrical connection between the ground circuit 412a and the conductive resin composition 463.

In the shielded printed wiring board 454, the first insulating layer 422 and the second insulating layer 432 may each include any material, and they each preferably include, for example, a thermoplastic resin composition, a thermosetting resin composition, or an active energy ray curable composition.

Non-limiting examples of the thermoplastic resin composition include a styrene resin composition, a vinyl acetate resin composition, a polyester resin composition, a polyethylene resin composition, a polypropylene resin composition, an imide resin composition, and an acrylic resin composition.

Among these, an imide resin composition is preferred, and a polyimide resin composition is more preferred.

Non-limiting examples of the thermosetting resin composition include an epoxy resin composition, a urethane resin composition, a urethane urea resin composition, a styrene resin composition, a phenolic resin composition, a melamine resin composition, an acrylic resin composition, and an alkyd resin composition.

Non-limiting examples of the active energy ray curable composition include a polymerizable compound containing at least two (meth) acryloyloxy groups in a molecule.

The first insulating layer 422 and the second insulating layer 432 may each consist of a single material or may each include two or more materials.

The first insulating layer 422 and the second insulating layer 432 may each further contain additives such as curing accelerators, tackifiers, antioxidants, pigments, dyes, plasticizers, ultraviolet absorbers, defoamers, leveling agents, fillers, flame retardants, viscosity modifiers, and anti-blocking agents, if needed.

The first insulating layer 422 and the second insulating layer 432 may each have any thickness. The thickness may be designed as appropriate, and is preferably 1 to 15 μm, more preferably 3 to 10 μm.

As shown in FIG. 37, the shielded printed wiring board 454 includes a first shielding layer 424 between the first insulating layer 422 and the conductive resin composition 463. The shielded printed wiring board 454 also includes a second shielding layer 434 between the second insulating layer 432 and the conductive resin composition 463.

The first shielding layer 424 may be made of metal or a first shielding layer conductive resin composition.

The second shielding layer 434 may be made of metal or a second shielding layer conductive resin composition.

Such first shielding layer 424 and second shielding layer 434 formed can suitably shield electromagnetic waves.

When the first shielding layer is made of metal, the metal may be gold, silver, copper, aluminum, nickel, tin, palladium, chromium, titanium, or zinc, for example.

When the second shielding layer is made of metal, the metal may be gold, silver, copper, aluminum, nickel, tin, palladium, chromium, titanium, or zinc, for example.

Preferred among these is copper. Copper is a material suitable for the first shielding layer in terms of conductivity and economic efficiency.

The first shielding layer 424 and the second shielding layer 434 may each be made of an alloy of any of the above metals.

They each may be metal foil or a metal film formed by a method such as sputtering, electroless plating, or electrolytic plating.

When the first shielding layer 424 is made of the first shielding layer conductive resin composition, the first shielding layer 424 may contain conductive particles and a resin.

When the second shielding layer 434 is made of the second shielding layer conductive resin composition, the second shielding layer 434 may contain conductive particles and a resin.

Non-limiting examples of the conductive particles in the first shielding layer 424 and the second shielding layer 434 include fine metal particles, carbon nanotubes, carbon fibers, and metal fibers.

When the conductive particles in the first shielding layer 424 and the second shielding layer 434 are fine metal particles, the fine metal particles may be any powder or particles such as silver powder, copper powder, nickel powder, solder powder, aluminum powder, silver-coated copper powder (silver-plated copper powder), or fine particles such as fine polymer particles or glass beads coated with metal.

In terms of economic efficiency, preferred among these is copper powder or silver-coated copper powder which can be available at low costs.

The conductive particles in the first shielding layer 424 and the second shielding layer 434 may have any average particle size, and the average particle size is preferably 0.5 to 15.0 μm. When the average particle size of the conductive particles is 0.5 μm or greater, good conductivity is achieved. When the average particle size of the conductive particles is 15.0 μm or smaller, the thickness of each of the first shielding layer 424 and the second shielding layer 434 can be small.

The conductive particles in each of the first shielding layer 424 and the second shielding layer 434 may have any shape and may be appropriately selected from spherical, flat, scale-like, dendrite, rod-like, and fibrous particles.

The amount of the conductive particles in each of the first shielding layer 424 and the second shielding layer 434 may be any amount and is preferably 15 to 90% by weight, more preferably 15 to 60% by weight.

Non-limiting examples of the resin in the first shielding layer 424 and the second shielding layer 434 include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition; and thermosetting resin compositions such as a phenolic resin composition, an epoxy resin composition, a urethane resin composition, a melamine resin composition, and an alkyd resin composition.

The conductive resin composition 463 in the shielded printed wiring board 454 contains a resin and conductive particles.

The resin in the conductive resin composition 463 may be a thermosetting resin or a thermoplastic resin.

Examples of the thermosetting resin include a phenolic resin, an epoxy resin, a urethane resin, a melamine resin, a polyamide resin, and an alkyd resin.

Examples of the thermoplastic resin include a styrene resin, a vinyl acetate resin, a polyester resin, a polyethylene resin, a polypropylene resin, an imide resin, and an acrylic resin.

Preferably, the epoxy resin is an amide-modified epoxy resin.

Non-limiting examples of the conductive particles in the conductive resin composition 463 include fine metal particles, carbon nanotubes, carbon fibers, and metal fibers.

When the conductive particles in the conductive resin composition 463 are fine metal particles, the fine metal particles may be any powder or particles such as silver powder, copper powder, nickel powder, solder powder, aluminum powder, silver-coated copper powder (silver-plated copper powder), or fine particles such as fine polymer particles or glass beads coated with metal.

In terms of economic efficiency, preferred among these is copper powder or silver-coated copper powder which can be available at low costs.

The conductive particles in the conductive resin composition 463 may have any average particle size, and the average particle size is preferably 0.5 to 15.0 µm. When the average particle size of the conductive particles is 0.5 µm or greater, good conductivity is achieved. When the average particle size of the conductive particles is 15.0 µm or smaller, the thickness of the conductive resin composition can be small.

The conductive particles in the conductive resin composition 463 may have any shape and may be appropriately selected from spherical, flat, scale-like, dendrite, rod-like, and fibrous particles.

The weight percent of the conductive particles in the conductive resin composition 463 is preferably 3 to 90% by weight, more preferably 39 to 90% by weight.

When the weight percent of the conductive particles is less than 3% by weight, sufficient shielding properties are less likely to be achieved. When the weight percent of the conductive particles is more than 90% by weight, the adhesion force of the conductive resin composition is likely to be low during production.

When the weight percent of the conductive particles is 39 to 90% by weight, the conductive resin composition 463 has isotropic conductivity.

Preferably, the conductive resin composition 463 is an isotropic conductive resin composition.

When the conductive resin composition 463 is an isotropic conductive resin composition, it can effectively shield electromagnetic noise emitted from the printed wiring board 410.

The shielded printed wiring board 454 can be produced by the method of producing a shielded printed wiring board of the present invention.

Other Embodiments

In the methods of producing a shielded printed wiring board according to the first to fourth embodiments of the present invention, the first electromagnetic wave shielding film and the second electromagnetic wave shielding film are placed so that each end of the first electromagnetic wave shielding film and each end of the second electromagnetic wave shielding film protrude from the respective ends of the printed wiring board.

Alternatively, in the method of producing a shielded printed wiring board of the present invention, the first electromagnetic wave shielding film and the second electromagnetic wave shielding film may be placed so that only one end of the first electromagnetic wave shielding film and only one end of the second electromagnetic wave shielding film protrude from an end of the printed wiring board.

Alternatively, the first electromagnetic wave shielding film and the second electromagnetic wave shielding film may be placed so that only part of one end of the first electromagnetic wave shielding film and only part of one end of the second electromagnetic wave shielding film protrude from an end of the printed wiring board.

In the methods of producing a shielded printed wiring board according to the first, third, and fourth embodiments of the present invention, the first adhesive layer and the second adhesive layer have conductivity.

Alternatively, in the method of producing a shielded printed wiring board of the present invention, the first adhesive layer and the second adhesive layer may not have conductivity. In other words, the first adhesive layer and the second adhesive layer may each be formed from an insulating resin composition.

In this case, the shielding layer is electrically connected to an external ground or the like. Thereby, an electromagnetic shielding effect can be obtained.

The shielded printed wiring board according to the fifth embodiment of the present invention includes the first shielding layer between the first insulating layer and the conductive resin composition, and the second shielding layer between the second insulating layer and the conductive resin composition.

Alternatively, the shielded printed wiring board of the present invention may include neither the first shielding layer nor the second shielding layer.

In this case, the conductive resin composition provides an electromagnetic shielding effect.

REFERENCE SIGNS LIST

- 10, 110, 210, 310, 410 printed wiring board
- 11, 111, 211, 311, 411 base film
- 12, 112, 212, 214, 312, 412 printed circuit
- 12*a*, 112*a*, 212*a*, 214*a*, 312*a*, 412*a* ground circuit
- 13, 113, 213, 215, 313, 413 coverlay
- 13*a*, 113*a*, 213*a*, 215*a* opening
- 20, 120, 220, 320 first electromagnetic wave shielding film
- 20*a*, 120*a*, 220*a*, 320*a* first electromagnetic wave shielding portion
- 21, 121, 221, 321 first protective film
- 22, 122, 222, 322, 422 first insulating layer
- 23, 123, 223, 323 first adhesive layer 23a, 123a, 223a, 323a first extending end portion
24, 224, 324, 424 first shielding layer
30, 130, 230, 330 second electromagnetic wave shielding film
30a, 320a, 320a, 320a second electromagnetic wave shielding portion
31, 131, 231, 331 second protective film
32, 132, 232, 332, 432 second insulating layer
33, 133, 233, 333 second adhesive layer
33a, 133a, 233a, 333a second extending end portion
34, 234, 334, 434 second shielding layer
40, 140, 240, 340 gap
51, 151, 251, 351 first intermediate product
52, 152, 252, 352 second intermediate product
53, 153, 253, 353 third intermediate product
54, 154, 254, 354, 454 shielded printed wiring board
316 through hole
422a first insulating layer extending end portion
432a second insulating layer extending end portion
463 conductive resin composition

The invention claimed is:

1. A method of producing a shielded printed wiring board, the method comprising:
a printed wiring board preparing step of preparing a printed wiring board including a base film, a printed circuit formed on the base film, and a coverlay covering the printed circuit;
a first electromagnetic wave shielding film preparing step of preparing a first electromagnetic wave shielding film sequentially including a first protective film, a first insulating layer, and a first adhesive layer;
a second electromagnetic wave shielding film preparing step of preparing a second electromagnetic wave shielding film sequentially including a second protective film, a second insulating layer, and a second adhesive layer;
a first electromagnetic wave shielding film placing step of placing the first electromagnetic wave shielding film on the printed wiring board so that the first adhesive layer is in contact with one face of the printed wiring board, and part of the first adhesive layer protrudes from an end of the printed wiring board to form a first extending end portion;
a second electromagnetic wave shielding film placing step of placing the second electromagnetic wave shielding film on the printed wiring board so that the second adhesive layer is in contact with the other face of the printed wiring board, and part of the second adhesive layer protrudes from an end of the printed wiring board to form a second extending end portion;
a stacking step of stacking the first extending end portion on the second extending end portion so that a gap is created between the first extending end portion and the second extending end portion, whereby a first intermediate product is prepared;
an initial pressing step of pressurizing and heating the first intermediate product to the extent that the first adhesive layer and the second adhesive layer are not completely cured and the gap remains present, whereby a second intermediate product is prepared;
a protective film peeling step of peeling off the first protective film and the second protective film from the second intermediate product, whereby a third intermediate product with the gap still present is prepared; and
a subsequent pressing step of pressurizing and heating the third intermediate product to cure the first adhesive layer and the second adhesive layer and to eliminate the gap, whereby the shielded printed wiring board is prepared.

2. The method of producing a shielded printed wiring board according to claim 1, wherein in the first electromagnetic wave shielding film preparing step and the second electromagnetic wave shielding film preparing step, a thickness of the first adhesive layer and a thickness of the second adhesive layer are controlled so that a sum of the thickness of the first adhesive layer of the first extending end portion and the thickness of the second adhesive layer of the second extending end portion after the subsequent pressing step is not smaller than one-thirtieth a thickness of the printed wiring board and not larger than the thickness of the printed wiring board.

3. The method of producing a shielded printed wiring board according to claim 1, wherein the first electromagnetic wave shielding film prepared in the first electromagnetic wave shielding film preparing step comprises a first shielding layer between the first insulating layer and the first adhesive layer.

4. The method of producing a shielded printed wiring board according to claim 3, wherein the first shielding layer comprises metal.

5. The method of producing a shielded printed wiring board according to claim 3, wherein the first shielding layer comprises a first shielding layer conductive resin composition.

6. The method of producing a shielded printed wiring board according to claim 3, wherein the first adhesive layer comprises a first adhesive layer resin and first adhesive layer conductive particles and has conductivity.

7. The method of producing a shielded printed wiring board according to claim 6, wherein a weight percent of the first adhesive layer conductive particles in the first adhesive layer is 3 to 90% by weight.

8. The method of producing a shielded printed wiring board according to claim 6,
wherein the printed circuit on the printed wiring board prepared in the printed wiring board preparing step comprises a ground circuit, part of the ground circuit being exposed, and
the pressurizing and heating in the subsequent pressing step are performed so that the ground circuit is electrically connected to the first adhesive layer.

9. The method of producing a shielded printed wiring board according to claim 1,
wherein in the first electromagnetic wave shielding film prepared in the first electromagnetic wave shielding film preparing step, the first insulating layer is adhered to the first adhesive layer, and
the first adhesive layer comprises a first adhesive layer resin and first adhesive layer conductive particles and has conductivity and an electromagnetic wave shielding function.

10. The method of producing a shielded printed wiring board according to claim 1, wherein the second electromagnetic wave shielding film prepared in the second electromagnetic wave shielding film preparing step comprises a second shielding layer between the second insulating layer and the second adhesive layer.

11. The method of producing a shielded printed wiring board according to claim 10, wherein the second shielding layer comprises metal.

12. The method of producing a shielded printed wiring board according to claim 10, wherein the second shielding layer comprises a second shielding layer conductive resin composition.

13. The method of producing a shielded printed wiring board according to claim 10, wherein the second adhesive layer comprises a second adhesive layer resin and second adhesive layer conductive particles and has conductivity.

14. The method of producing a shielded printed wiring board according to claim 13, wherein a weight percent of the second adhesive layer conductive particles in the second adhesive layer is 3 to 90% by weight.

15. The method of producing a shielded printed wiring board according to claim 13,
wherein the printed circuit on the printed wiring board prepared in the printed wiring board preparing step comprises a ground circuit, part of the ground circuit being exposed, and
the pressurizing and heating in the subsequent pressing step are performed so that the ground circuit is electrically connected to the second adhesive layer.

16. The method of producing a shielded printed wiring board according to claim 1,
wherein in the second electromagnetic wave shielding film prepared in the second electromagnetic wave shielding film preparing step, the second insulating layer is adhered to the second adhesive layer, and
the second adhesive layer comprises a second adhesive layer resin and second adhesive layer conductive particles and has conductivity and an electromagnetic wave shielding function.

17. The method of producing a shielded printed wiring board according to claim 1, wherein the first insulating layer comprises at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin.

18. The method of producing a shielded printed wiring board according to claim 1, wherein the second insulating layer comprises at least one selected from the group consisting of a polyimide resin, a polyamide-imide resin, a polyamide resin, a polyether imide resin, a polyester imide resin, a polyether nitrile resin, a polyether sulfone resin, a polyphenylene sulfide resin, a polyethylene terephthalate resin, a polypropylene resin, a cross-linked polyethylene resin, a polyester resin, a polybenzimidazole resin, a polyimide resin, a polyimide-amide resin, a polyether imide resin, and a polyphenylene sulfide resin.

19. The method of producing a shielded printed wiring board according to claim 1, wherein the pressurizing and heating in the initial pressing step are performed at 0.2 to 0.7 MPa and 100° C. to 150° C. for 1 to 10 s.

20. The method of producing a shielded printed wiring board according to claim 1, wherein the pressurizing and heating in the subsequent pressing step are performed at 1 to 5 MPa and 150° C. to 190° C. for 60 s to 2 h.

\* \* \* \* \*